US008841818B2

(12) United States Patent
Marathe et al.

(10) Patent No.: US 8,841,818 B2
(45) Date of Patent: Sep. 23, 2014

(54) PIEZOELECTRIC ELECTROMECHANICAL DEVICES

(75) Inventors: Radhika Marathe, Cambridge, MA (US); Dana Weinstein, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 327 days.

(21) Appl. No.: 13/209,208

(22) Filed: Aug. 12, 2011

(65) Prior Publication Data

US 2013/0038383 A1 Feb. 14, 2013

(51) Int. Cl.
  *H01L 41/08* (2006.01)
  *H01L 41/113* (2006.01)
  *H01L 29/51* (2006.01)
  *H01L 29/78* (2006.01)
  *H01L 41/09* (2006.01)
  *H01L 29/84* (2006.01)

(52) U.S. Cl.
  CPC ........ *H01L 41/0986* (2013.01); *H01L 41/1132* (2013.01); *H01L 29/518* (2013.01); *H01L 29/517* (2013.01); *H01L 29/7842* (2013.01); *H01L 29/84* (2013.01)
  USPC ............................ 310/317; 310/318; 310/319

(58) Field of Classification Search
  USPC .......................... 310/311, 314, 315, 317–319
  See application file for complete search history.

(56) References Cited

U.S. PATENT DOCUMENTS

| 3,414,832 | A | * | 12/1968 | Newell | 330/286 |
| 3,585,415 | A | * | 6/1971 | Muller et al. | 310/319 |
| 3,792,321 | A | * | 2/1974 | Seifert | 257/416 |
| 3,805,601 | A | * | 4/1974 | Jeffers | 73/777 |
| 5,293,138 | A | * | 3/1994 | Kansy | 333/193 |
| 5,883,419 | A | | 3/1999 | Lee et al. | |
| 6,727,522 | B1 | * | 4/2004 | Kawasaki et al. | 257/103 |
| 7,687,971 | B2 | * | 3/2010 | Stokes et al. | 310/313 B |
| 7,864,558 | B2 | | 1/2011 | Krieger | |
| 2008/0290384 | A1 | | 11/2008 | Lolivier et al. | |
| 2011/0049579 | A1 | | 3/2011 | Dumitru et al. | |

OTHER PUBLICATIONS

Abdolvand, R. et al., "Monolithic Thin-Film Piezoelectric-on-Substrate Filters," IEEE MIT-S International Microwave Symposium, Honolulu, Hawaii, Jun. 2007, pp. 509-512.

Greeneich, E.W. et al., "Theoretical Transducer Properties of Piezoelectric Insulator FET Transducers," Journal of Applied Physics, vol. 46, No. 11, Nov. 1975, pp. 4631-4640.

Kaajakari, V. et al., "Electrostatic Transducers for Micromechanical Resonators Free Space and Solid Dielectric," IEEE Transactions on Ultrasonics, Ferroelectrics and Frequency Control, vol. 53, No. 12, Dec. 2006, pp. 2484-2489.

Kanda, Y., "A Graphical Representation of the Piezoresistance Coefficients in Silicon," IEEE Transactions on Electron Devices, vol. 29, No. 1, Jan. 1982, pp. 64-70.

(Continued)

*Primary Examiner* — Thomas Dougherty
(74) *Attorney, Agent, or Firm* — Wolf, Greenfield & Sacks, P.C.

(57) ABSTRACT

An piezoelectric electromechanical transistor has first and second terminals formed in a semiconductor region, a gate and a piezoelectric region between the gate and the semiconductor region. The piezoelectric region may be configured to drive the semiconductor region to vibrate in response to a signal applied to the gate. The transistor may be configured to produce a signal at the first terminal at least partially based on vibration of the semiconductor region.

32 Claims, 10 Drawing Sheets

(56) References Cited

OTHER PUBLICATIONS

Larson, J.D., III et al., "A BAW Antenna Duplexer for the 1900 MHz PCS Band," Ultrasonics Symposium, 1999. Proceedings. 1999 IEEE, vol. 2 (1999), pp. 887-890.

Piazza, G., "Piezoelectric Aluminum Nitride Vibrating RF MEMS for Radio Front-End Technology," Ph.D. Thesis, University of California, Berkeley, Dec. 2005, 135 pages.

Stephanou, P.J., "Piezoelectric Aluminum Nitride MEMS Resonators for RF Signal Processing," Ph.D. Thesis, University of California, Berkeley, Dec. 2006, 197 pages.

Stevens, K.S. et al., "Microstructure of AlN on Si(111) Grown by Plasmaassisted Molecular Beam Epitaxy," Applied Physics Letters, vol. 65, No. 3, Jul. 1994, pp. 321-323.

Tabrizian, R. et al., "Effect of Phonon Interactions on Limiting the $f \cdot Q$ Product of Micromechanical Resonators," Proc. of IEEE Transducers, (2009), pp. 2131-2134.

Wang, W. et al., "An Unreleased MM-Wave Resonant Body Transistor," IEEE $24^{th}$ International Conference on Micro Electro Mechanical Systems, Jan. 23-27, 2011, pp. 1341-1344.

Weinstein, D., "The Resonant Body Transistor," Nano Letters 10(4), (2010), pp. 1234-1237.

Weinstein, D., "The Resonant Body Transistor," PhD Thesis, Cornell University, Aug. 2009.

Yimnirun, R. et al., "Electrostriction Measurements on Low Permittivity Dielectric Materials," Annual report. Conference on Electrical Insulation and Dielectric Phenomena, Oct. 25-28, 1998, pp. 240-243.

Zuo, C. et al., Switch-Less Dual-Frequency Reconfigurable CMOS Oscillator Using One Single Piezoelectric ALN MEMS Resonator with Co-Existing S0 and S1 Lamb-Wave Mode, IEEE International Conference on Micro Electro Mechanical Systems, Cancun, Mexico, Jan. 23-27, 2011, pp. 177-180.

International Search Report and Written Opinion dated Dec. 27, 2012 from corresponding application No. PCT/US2012/050271.

* cited by examiner

PIEZOELECTRIC ELECTROMECHANICAL DEVICES

STATEMENT REGARDING FEDERALLY SPONSORED RESEARCH OR DEVELOPMENT

This invention was made with government funding under Grant No. N66001-10-1-4046, awarded by the Space and Naval Warfare Systems Center. The government has certain rights in this invention.

BACKGROUND

1. Field of Invention

The techniques and apparatus described herein relate to piezoelectric electromechanical devices such as piezoelectric electromechanical transistors.

2. Discussion of the Related Art

Resonators are widely used in communication applications as filter components and as signal sources at selected frequencies. Some communication devices use conventional LC tank resonator circuits which have difficulty meeting the insertion loss, quality factor and out-of-band rejection capabilities needed to meet today's filtering requirements. A significant proportion of cellular telephones currently in use have large passive mechanical components such as Surface Acoustic Wave (SAW) and Film Bulk Acoustic Resonator (FBAR) components which have seen very little miniaturization over the past few years.

Microelectromechanical resonators can be produced having quality factors (Q) that are often several orders of magnitude higher than those of LC circuits, and offer the potential for integration using microfabrication. As the size of transistors continues to shrink, transistor threshold frequencies have increased, enabling transceiver circuitry to be designed to operate at frequencies in the range of tens of GHz. Conventional microelectromechanical resonators are not well-suited to such high frequency applications at least in part because of their capacitive coupling, which causes undesirable capacitive feedthrough between the input and output terminals at high frequencies.

SUMMARY

Some embodiments relate to a piezoelectric electromechanical transistor that includes a semiconductor region in which are formed first and second terminals of the piezoelectric electromechanical transistor, a gate and a piezoelectric region between the gate and the semiconductor region. The piezoelectric region is configured to induce a change in strain of the semiconductor region in response to a signal applied to the gate.

Some embodiments relate to a piezoelectric electromechanical transistor that includes a semiconductor region in which are formed first and second terminals of the piezoelectric electromechanical transistor, a gate and a piezoelectric region between the gate and the semiconductor region. A signal is produced at the first terminal at least partially based on a change in strain of the semiconductor region.

Some embodiments relate to method that includes providing a first signal to a gate of a transistor to induce a change in strain of a semiconductor region using the piezoelectric effect, and receiving a second signal from the semiconductor region produced by the transistor.

Some embodiments relate to a piezoelectric electromechanical device that includes a first gate, a first piezoelectric region, a first region, a second piezoelectric region, and a second gate. The first piezoelectric region is configured to induce the piezoelectric electromechanical device to vibrate in response to a signal applied to the first gate.

Some embodiments relate to a method that includes applying a signal to a gate that creates strain in a piezoelectric material, thereby causing vibration and/or movement of a transistor.

Some embodiments relate to a method that includes receiving a signal from a drain based on strain of a piezoelectric material and a semiconductor material due to movement and/or vibration of a transistor.

The foregoing summary is provided by way of illustration and is not intended to be limiting.

BRIEF DESCRIPTION OF DRAWINGS

In the drawings, each identical or nearly identical component that is illustrated in various figures is represented by a like reference character. For purposes of clarity, not every component may be labeled in every drawing. The drawings are not necessarily drawn to scale, with emphasis instead being placed on illustrating various aspects of the techniques and devices described herein.

FIG. 1b shows a cross-sectional view of the piezoelectric electromechanical transistor of FIG. 1a.

FIG. 4b shows a cross-sectional view of the passive piezoelectric electromechanical device of FIG. 4a.

FIG. 5 shows a plot of the motional impedance $R_X$ as a function of the gate voltage $V_{GS}$.

FIG. 6 shows a plot of $R_X$ as a function of the position of the piezoelectric films from the center of the device (d) for a device operating in the third harmonic n=3.

FIG. 7 shows a plot of $R_X$ as a function of the thickness of the piezoelectric films (g) and for thickness normalized to the wavelength, for a device operating in the third harmonic n=3.

FIG. 8 shows a plot of $R_X$ as a function of the channel length.

FIG. 9 shows a plot of $R_X$ as a function of the frequency for devices operating in the third harmonic n=3.

DETAILED DESCRIPTION

Described herein are embodiments of a piezoelectric electromechanical transistor that can integrate both a transistor and a resonator in the same device. Integrating a transistor with a resonator can enable reducing the capacitive floor with respect to the output signal by electromechanically amplifying the mechanical signal. The use of piezoelectric actuation and/or sensing can reduce the impedance of the device by increasing the electromechanical coupling coefficient.

Figure 1A:
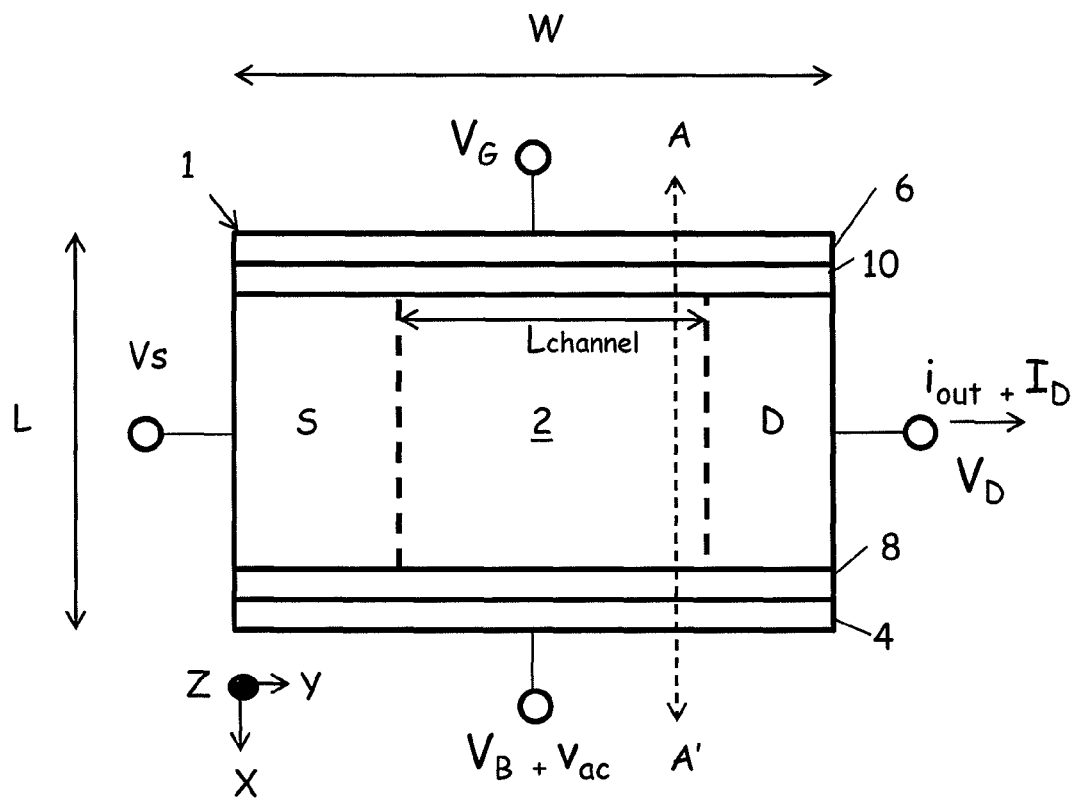
FIG. 1a shows a top view of a piezoelectric electromechanical transistor, according to some embodiments.
Figure 1B:
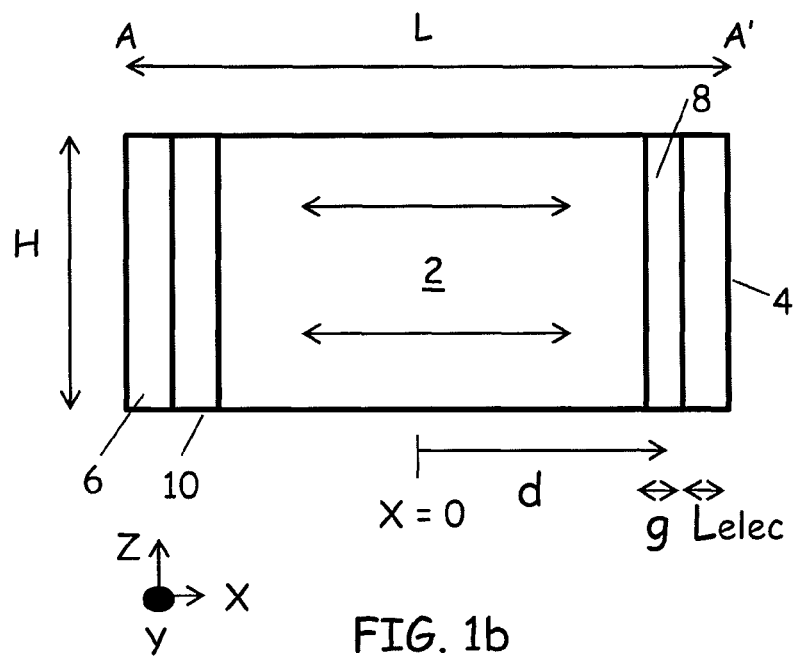

FIG. 1a shows a top view of a piezoelectric electromechanical transistor 1, according to some embodiments. Piezoelectric electromechanical transistor 1 includes a semiconductor region 2, a first gate 4, a second gate 6, a first piezoelectric region 8 and a second piezoelectric region 10. The body of the piezoelectric electromechanical transistor 1 may be formed in semiconductor region 2. As shown in FIG. 1a, the first piezoelectric region 8 contacts the first gate 4 and the semiconductor region 2, and the second piezoelectric region 10 contacts the second gate 6 and the semiconductor region 2 on the opposite side of the semiconductor region 2. As shown in FIG. 1a, the piezoelectric electromechanical transistor 1 has a length L extending across the five regions 2, 4, 6, 8 and 10 along the x-axis of FIG. 1a, and a width W extending along the y-axis of FIG. 1a. FIG. 1b shows a cross section of the piezoelectric electromechanical transistor 1 along the line A-A' of FIG. 1a. In some embodiments, gates 4 and 6 may have the same length, and piezoelectric regions 8 and 10 may have the same length. However, the lengths of these regions do not need to be the same, as any suitable lengths may be chosen.

In some embodiments, piezoelectric electromechanical transistor 1 may be formed using a semiconductor wafer with suitable microfabrication techniques, such as surface micromachining, bulk micromachining, or any other suitable technique. The piezoelectric electromechanical transistor 1 may be formed in any suitable orientation with respect to the semiconductor crystal. In some embodiments, the semiconductor region 2 may be formed from a device layer of an SOI (silicon on insulator) wafer. However, piezoelectric electromechanical transistor 1 need not be formed using a semiconductor wafer, as piezoelectric electromechanical transistor 1 may be formed using any suitable material or type of substrate.

In piezoelectric electromechanical transistor 1, semiconductor region 2 may be formed of silicon or any other suitable type of semiconductor material, such as another group IV semiconductor material (e.g., germanium), a III-V semiconductor material or a II-VI semiconductor material. Piezoelectric regions 8 and 10 may be formed of any of a variety of piezoelectric materials, such as aluminum nitride (AlN), gallium nitride (GaN), or zinc oxide (ZnO), for example. Gates 4 and 6 may be formed of a metal, such as molybdenum, for example, or a semiconductor material such as polysilicon. If the piezoelectric films are leaky, a dielectric may be added to the surface of the piezoelectric regions 8 and/or 10 to insulate the piezoelectric region from the gate and/or semiconductor region. Such a dielectric may be formed of a material such as silicon nitride (SiN), hafnia ($HsO_2$), silicon dioxide ($SiO_2$) or any other suitable dielectric material. The materials described herein are listed merely by way of example, as the techniques and devices described herein are not limited to particular materials.

In the embodiment illustrated in FIGS. 1a and 1b, the piezoelectric electromechanical transistor 1 is formed in the shape of a bar resonator with regions 2, 4, 6, 8 and 10 each having a cuboid shape. However, the piezoelectric electromechanical transistors described herein are not limited to being formed in a bar shape, as piezoelectric electromechanical transistors may be formed in any of a variety of shapes. For example, in some embodiments, the piezoelectric electromechanical transistors may be formed in a ring shape or a disk shape, or any other suitable shape.

Semiconductor region 2 forms the body of piezoelectric electromechanical transistor 1. Any suitable type of transistor may be used in piezoelectric electromechanical transistor 1, such as a field effect transistor (FET) or a high electron mobility transistor (HEMT), for example. In the embodiment shown in FIGS. 1a and 1b, piezoelectric electromechanical transistor 1 uses a FET in which a source region S and drain region D of the FET are formed in semiconductor region 2 as first and second terminals of the FET, as shown in FIG. 1a, with dashed lines demarcating the boundaries of the source and drain regions. Source region S and drain region D may be highly-doped regions of the same conductivity type (e.g., both having an N-type or P-type dopant). A channel can be formed in the channel region of semiconductor region 2 between source region S and drain region D along the y-axis direction in response to a voltage applied to gate 4 and/or gate 6. The channel region can be formed of intrinsic semiconductor or may be doped to have a conductivity type opposite to that of the source region S and the drain region D. For example, if source region S and drain region D are doped as N-type regions, the channel region may be doped as a P-type region. Alternatively, if source region S and drain region D are doped as P-type regions, the channel region may be doped as an N-type region. Source region S and drain region D may be biased at suitable DC voltage levels. The selection of suitable bias voltages for the source and drain regions and the gates 4,6 will be discussed in further detail below. In some embodiments, gate 4 may be used as the driving gate of the piezoelectric electromechanical transistor 1.

In some embodiments of piezoelectric electromechanical transistor 1, applying an AC voltage to gate 4 generates an electric field in piezoelectric region 8 that produces a strain in the piezoelectric region 8 based on the piezoelectric properties of piezoelectric region 8. In response to an electric field along the x-axis, the piezoelectric region 8 may expand and contract along the x-axis, causing the piezoelectric electromechanical transistor 1 to vibrate. The piezoelectric electromechanical transistor 1 may be driven to resonate in response to the driving signal applied to the gate 4. The piezoelectric electromechanical transistor 1 may thereby vibrate in a bulk acoustic wave mode, back and forth along the x-axis. In a bulk acoustic wave mode of vibration, substantially the entire piezoelectric electromechanical transistor 1 may be driven to vibrate throughout substantially the entire height H of the piezoelectric electromechanical transistor 1. In response to an AC driving voltage, the piezoelectric electromechanical transistor 1 may be driven to resonate at its resonance frequency. As the piezoelectric electromechanical transistor resonates, the mobility and concentration of carriers between the source and drain regions of the piezoelectric electromechanical transistor 1 is modulated by the varying strain produced in the semiconductor and piezoelectric regions. The changing strain of the piezoelectric electromechanical device 1 can be sensed to generate an output signal at a drain region D of the transistor.

In some embodiments, the resonance frequency of the piezoelectric electromechanical transistor 1 may be in the range of 100 MHz or higher. However, the piezoelectric electromechanical transistor 1 may be constructed to have any suitable resonance frequency, such as a resonance frequency in the kHz range or the MHz range, as the techniques described herein are not limited in this respect.

Although piezoelectric electromechanical transistor 1 has been described as operating in a bulk acoustic wave mode, the piezoelectric electromechanical transistor may operate in other modes of vibration, such as a flexural mode of vibration or a shear mode of vibration, as the techniques described herein are not limited to operation of the device in a bulk acoustic wave mode of vibration. Depending on the shape and structure of the piezoelectric electromechanical transistor 1, the piezoelectric electromechanical transistor may be driven to resonate in various modes of vibration such as a breathing mode of vibration, a wine glass mode of vibration, or another mode of vibration.

In some embodiments, acoustic vibrations may be driven piezoelectrically, through the e33 piezoelectric coupling coefficient, resulting in a high driving stress and large amplitude of vibrations. On the sensing side, the piezoelectric region 10 may experience a strain due to the longitudinal vibrations in the piezoelectric electromechanical transistor 1, and this results in a modulation in the polarization which produces an electric field across the piezoelectric region through the inverse piezoelectric coefficient. An output signal can be sensed as a modulation in the DC transistor current. The piezoelectric and piezoresistive components typically are the dominant terms over the capacitive contribution.

An analytical model for the embodiment of the piezoelectric electromechanical transistor 1 shown in FIGS. 1*a* and 1*b* is discussed below.

Table of Parameters

| Parameter | Description |
|---|---|
| L | Length of Device along the dimension of vibration |
| W | Width of device, along direction of the transistor channel |
| H | Thickness of device, along the z-axis dimension of FIG. 1b |
| $V_D$ | Drain Voltage |
| $V_A$ | Back-gate 4 DC voltage |
| $v_{ac}$ | Back-gate 4 AC voltage |
| g | Thickness of piezoelectric film 8 and/or 10 |
| $e_{33}$ | Piezoelectric coefficient along c-axis |
| $Q_{33}$ | Electrostrictive coefficient of piezoelectric coupling |
| n | Number of harmonic |
| $f_n$ | Frequency of operation at nth harmonic |
| $U_0$ | Amplitude of vibrations |
| d | Center-to-center distance between piezoelectric films |
| $E_x$ | Young's modulus of material x along the dimension of vibration |
| $\rho_x$ | Density of material x |
| $L_{elec}$ | Length of gate along the dimension of resonance |
| Q | Quality factor of device at frequency f |
| $\epsilon_0$ | Permittivity of free space |
| $k_{piezo}$ | Relative permittivity of piezoelectric material |
| $L_{channel}$ | Length of the channel region ($L_{gate}$) between source and drain |
| $\mu_n$ | Electron mobility in channel |
| $V_T$ | Threshold Voltage |
| $k_{Si}$ | Relative Permittivity of Si |
| q | Elementary Charge |
| $N_A$ | Doping of the device body |
| k | Boltzmann Constant |
| T | Temperature of operation |
| $n_i$ | Intrinsic Carrier Concentration in Si |
| $Q_{piezo}$ | Induced sheet charge in channel due to piezoelectric effect |
| $V_{piezo}$ | Induced voltage on gate 6 due to piezoelectric effect |
| $\pi_{111}$ | Piezoresistive coefficient in Si along the <111> direction |

Driving of Acoustic Vibrations
Piezoelectric Contribution

Piezoelectric electromechanical transistor 1 may be operated as a transistor by biasing the source voltage $V_s$ at ground and by applying a DC voltage $V_D$ to the drain and a DC voltage $V_G$ to gate 6. The driving gate 4 (e.g., the back gate) of the piezoelectric electromechanical transistor 1 may be biased into accumulation by applying a DC voltage $V_A$. A small AC voltage $v_{ac}e^{j\omega_n t}$ may also be applied to the driving gate 4, in addition to $V_A$, to drive acoustic waves into the piezoelectric electromechanical transistor 1. Thus, the net voltage applied across the driving gate 4 is $V_A + v_{ac}e^{j\omega_n t}$ with respect to the source and $V_A + v_{ac}e^{j\omega_n t} - V_D$ with respect to the drain. This results in an average driving voltage of $$\frac{V_A + v_{ac}e^{j\omega_n t} - V_D}{2}$$

and an average value for the electric field across the piezoelectric region 8, which may be an AlN film of thickness g, is $$\frac{V_A + v_{ac}e^{j\omega_n t} - V_D}{2g}$$

The equations of piezoelectricity may be expressed in the following manner:

$$T = cS - e^T E$$

$$D = eS + \in E$$

in which S is the strain matrix, T is the stress, c is the compliance matrix. E is the electric field applied externally and D is the electric displacement matrix. e and $e^T$ are the piezoelectric matrices (direct and transpose) and $\in$ is the dielectric matrix.

For a crystal with hexagonal symmetry such as AlN, this matrix assumes the following form:

$$\begin{bmatrix} T_1 \\ T_2 \\ T_3 \\ T_4 \\ T_5 \\ T_6 \end{bmatrix} =$$

$$\begin{bmatrix} c_{11} & c_{12} & c_{13} & 0 & 0 & 0 \\ & c_{11} & c_{12} & 0 & 0 & 0 \\ & & c_{33} & 0 & 0 & 0 \\ & & & c_{44} & 0 & 0 \\ & & & & c_{44} & 0 \\ & & & & & \frac{c_{11}-c_{12}}{2} \end{bmatrix} \begin{bmatrix} S_1 \\ S_2 \\ S_3 \\ S_4 \\ S_5 \\ S_6 \end{bmatrix} - \begin{bmatrix} 0 & 0 & e_{31} \\ 0 & 0 & e_{31} \\ 0 & 0 & e_{33} \\ 0 & e_{24} & 0 \\ e_{15} & 0 & 0 \\ 0 & 0 & 0 \end{bmatrix} \begin{bmatrix} E_1 \\ E_2 \\ E_3 \end{bmatrix}$$

$$\begin{bmatrix} D_1 \\ D_2 \\ D_3 \end{bmatrix} = \begin{bmatrix} \varepsilon_1 & 0 & 0 \\ & \varepsilon_1 & 0 \\ & & \varepsilon_3 \end{bmatrix} \begin{bmatrix} E_1 \\ E_2 \\ E_3 \end{bmatrix} + \begin{bmatrix} 0 & 0 & 0 & 0 & e_{15} & 0 \\ 0 & 0 & 0 & e_{15} & 0 & 0 \\ e_{31} & e_{31} & e_{33} & 0 & 0 & 0 \end{bmatrix} \begin{bmatrix} S_1 \\ S_2 \\ S_3 \\ S_4 \\ S_5 \\ S_6 \end{bmatrix}$$

Using the above, the resultant in-plane stress in the piezoelectric film, $\sigma_{piezo}$, along the direction of the electric field, which is also along the direction of the c-axis of an AlN crystal is given by $$\sigma_{piezo} = e_{33}\frac{V_A + v_{ac}e^{j\omega_n t} - V_D}{2g} = e_{33}\left(\frac{V_A - V_D}{2g} + \frac{v_{ac}e^{j\omega_n t}}{2g}\right)$$

Thus, the AC stress, $\sigma_p$, is given by $$\sigma_p = e_{33}\frac{v_{ac}e^{j\omega_n t}}{2g}.$$

Electrostrictive Contribution

In addition to the piezoelectric effect, electrostriction may also contribute to stress in the piezoelectric films. Mathematically, electrostriction can be defined as the quadratic coupling between strain (s) and electric field (E), or between strain and polarization (P). This is a fourth-rank tensor expressed by the following relationships:

$$s_{ij} = c^E_{ijkl}T_{ij} + M_{ijmn}E_m E_n$$

$$s_{ij} = c^P_{ijkl}T_{ij} + Q_{ijmn}P_m P_n.$$

Using the second equation above, one can see that for a piezoelectric film such as AlN, the strain along the direction i, j is defined as $s_{ij}$, is related to the stress along that direction $T_{ij}$, through the compliance $c^P_{ijkl}$ and to the polarization along the directions m and n, through the coefficient $Q_{ijmn}$. If one applies an electric field in only one direction, for example, along the c-axis of the piezoelectric material, the resultant electrostrictive stress, $\sigma_{estric}$, will be expressed in terms of $E_{piezo}$, the Young's Modulus of the material and $s_{33}$, the strain along the c-axis as:

$$\sigma_{estric} = E_{piezo} s_{33}$$

This expands to:

$$\sigma_{estric} = E_{piezo} Q_{33} P_3^2$$

$$= E_{piezo} Q_{33} \varepsilon_0^2 (k_{piezo} - 1)^2 \left(\frac{V}{g}\right)^2$$

Where $\varepsilon_0$ is the permittivity of free space, $k_{piezo}$, is the relative permittivity of the piezoelectric film of thickness g, and V is the voltage applied across it.

From these equations, the stress induced due to electrostriction, $\sigma_{estric}$, or is given by:

$$\sigma_{estric} = E_{piezo} Q_{33} \varepsilon_0^2 (k_{piezo} - 1)^2 \left(\frac{V_A - V_D + v_{ac} e^{j\omega_n t}}{2g}\right)^2$$

$$= \frac{E_{piezo} Q_{33} \varepsilon_0^2 (k_{piezo} - 1)^2}{4g^2}$$

$$((V_A - V_D)^2 + 2(V_A - V_D)v_{ac} e^{j\omega_n t} + v_{ac}^2 e^{2j\omega_n t})$$

Ignoring the DC component and the component at frequency $2\omega_n$, the AC component of the electrostrictive stress is given by:

$$\sigma_e \approx \frac{E_{piezo} Q_{33} \varepsilon_0^2 (k_{piezo} - 1)^2}{2g^2} (V_A - V_D) v_{ac} e^{j\omega_n t}$$

Thus, the total driving stress will be $\sigma_{drive} = \sigma_p + \sigma_e$

Acoustic Vibrations in the Structure

The Resonance Frequency

The wave equation for the modal shape for the piezoelectric electromechanical transistor 1 can be constructed by modeling it as a lateral mode bar resonator:

$$u(x,t) = U_0 \sin(k_n x) \cdot e^{j\omega_n t}$$

where $U_0$ is the amplitude of vibrations and the wave number, $k_n$, for the $n^{th}$ harmonic is given by $$k_n = \frac{2\pi}{\lambda_n} = \frac{n\pi}{L}$$

and the resonance frequency, $\omega_n$, given by:

$$\omega_n = \frac{n\pi}{L} \sqrt{\frac{E_{eff}}{\rho_{eff}}}$$

where $E_{eff}$ and $\rho_{eff}$ are the effective Young's modulus and the density of the piezoelectric electromechanical transistor 1.

One may calculate the resonance frequency using the method of fractional wavelengths. At resonance, for a standing wave to be formed in the resonator, the following relationship holds:

$$L = n\frac{\lambda_n}{2}.$$

As the piezoelectric electromechanical transistor 1 includes a stack of materials with different acoustic velocities, for a resonance frequency $f_n$, the acoustic wavelength corresponding to a material is given by $$\lambda_x = \frac{vel_x}{f_n}$$

When gates 4 and 6 are formed of molybdenum, the wavelength is given by:

$$\lambda_{Mo} = \frac{vel_{Mo}}{f_n} = \frac{1}{f_n} \sqrt{\frac{E_{Mo}}{\rho_{Mo}}}$$

Similarly, one may determine the acoustic wavelengths in each of the films using the Young's moduli, E, and density, $\rho$, of the constituent materials, Si for silicon, piezo for the piezoelectric film and Mo for molybdenum gate material. Due to the condition of forming a standing wave at resonance, total length is a multiple of a half-wavelength. Since the wavelength in each material is different, one may assume that the sum of fractional wavelengths in each material constituting the resonator is a multiple of ½. This may be expressed as:

$$\frac{2L_{Mo}}{\lambda_{Mo}} + \frac{2L_{piezo}}{\lambda_{piezo}} + \frac{L_{Si}}{\lambda_{Si}} = \frac{n}{2}$$

Substituting for the expression for the wavelengths, $$f_n \left( \frac{2L_{Mo}}{\sqrt{\frac{E_{Mo}}{\rho_{Mo}}}} + \frac{2L_{piezo}}{\sqrt{\frac{E_{piezo}}{\rho_{piezo}}}} + \frac{L_{Si}}{\sqrt{\frac{E_{Si}}{\rho_{Si}}}} \right) = \frac{n}{2}$$

$$f_n = \left(\frac{n}{2}\right) \frac{1}{\frac{2L_{Mo}}{\sqrt{\frac{E_{Mo}}{\rho_{Mo}}}} + \frac{2L_{piezo}}{\sqrt{\frac{E_{piezo}}{\rho_{piezo}}}} + \frac{L_{Si}}{\sqrt{\frac{E_{Si}}{\rho_{Si}}}}}$$

$E_{eff}$ and $\rho_{eff}$ $E_{eff}$ and $\rho_{eff}$ may be calculated as the effective Young's modulus and the density of the piezoelectric electromechanical transistor 1. Vibrations may occur along x-axis, which includes a five-film stack of materials forming piezoelectric electromechanical transistor 1. These five films may be modeled as five springs vibrating in series in response to a bulk acoustic wave. It can be assumed that each of these films is a cuboidal bar, and the spring constant for the same can be calculated. For such a bar with length l, and cross sectional area w×h, the spring constant $k_{bar}$ for a force along the length l, is given by:

$$k_{bar} = \frac{Ewh}{l}$$

Thus, in this case, for gates 4 and 6 formed of molybdenum, with Young's modulus $E_{Mo}$, the spring constant $k_{Mo}$ will be $$k_{Mo} = \frac{E_{Mo} W H}{L_{Mo}}$$

The spring constant for the other films may be determined in a similar manner. The spring constant, $k_{eff}$ can be determined using the effective resonance length L of the piezoelectric electromechanical transistor 1, as $$k_{eff} = \frac{E_{eff} W H}{L}$$

For the five springs vibrating in series, the individual spring constants are related to the effective spring constant as:

$$\frac{1}{k_{eff}} = \sum \frac{1}{k_i}$$

$$\frac{L}{E_{eff} W H} = \frac{2 L_{Mo}}{E_{Mo} W H} + \frac{2 L_{piezo}}{E_{piezo} W H} + \frac{L_{Si}}{E_{Si} W H}$$

Canceling the common terms and rearranging, $$E_{eff} = \frac{L}{\frac{2 L_{Mo}}{E_{Mo}} + \frac{2 L_{piezo}}{E_{piezo}} + \frac{L_{Si}}{E_{Si}}}$$

Using the above value, the effective density is given by the relation $$f_n = \frac{\omega_n}{2\pi} = \frac{n\pi}{2\pi L} \sqrt{\frac{E_{eff}}{\rho_{eff}}}$$

$$\rho_{eff} = \left(\frac{n}{2 f_n L}\right)^2 E_{eff}$$

Amplitude of Vibrations

One can use the equation for damped vibrations in a bar (1D) to solve for the amplitude of vibrations:

$$A \rho_{eff} \frac{\partial^2 u(x,t)}{\partial t^2} - A b \frac{\partial^3 u(x,t)}{\partial t \partial x^2} - A E_{eff} \frac{\partial^2 u(x,t)}{\partial x^2} = A \frac{d\sigma_{drive}}{dx}$$

However, before using this equation to calculate the amplitude of vibrations, the damping coefficient b may be calculated in terms of material properties and other measurable quantities.

Term A may be canceled throughout and $u(x,t)=U(t)\sin(k_n x)$ substituted into the beam equation, where $U(t)=U_0 e^{j\omega_n t}$. Thus:

$$\rho_{eff} \frac{\partial^2 U(t)\sin(k_n x)}{\partial t^2} + k_n^2 \frac{\partial U(t)\sin(k_n x)}{\partial t} + E_{eff} k_n^2 U(t)\sin(k_n x) =$$

-continued $$\frac{d\sigma_{drive}}{dx} = f(x,t)$$

The Laplace transform on both sides is taken with respect to the variable t and initial conditions of displacement and strain are set to zero. Let the Laplace transform of $U(t)\sin(k_n x)$ be denoted by $\mathcal{U}(x,s)$ and the Laplace transform of the RHS be denoted by $F(x,s)$ to get:

$$\mathcal{U}(x,s)[\rho_{eff} s^2 + b k_n^2 s + E_{eff} k_n^2] = F(x,s)$$

This may be re-written as the transfer function $H(s)$ given by:

$$H(s) = \frac{\mathcal{U}(x,s)}{F(x,s)} = \frac{\frac{1}{\rho_{eff}}}{s^2 + \frac{b k_n^2}{\rho_{eff}} s + \frac{E_{eff} k_n^2}{\rho_{eff}}}$$

This is a second order system response, the denominator of which may be compared to the denominator of the second order harmonic oscillator response with quality factor (Q) and an undamped resonance frequency, $\omega_n$, which is given by:

$$H(s) = \frac{\omega_n^2}{s^2 + \frac{\omega_n}{Q} s + \omega_n^2}$$

Equating the constant, $$\frac{E_{eff} k_n^2}{\rho_{eff}} = \omega_n^2$$

one may equate the coefficient of the s term to determine the damping coefficient b as:

$$\frac{b k_n^2}{\rho_{eff}} = \frac{\omega_n}{Q} = \frac{k_n}{Q} \sqrt{\frac{E_{eff}}{\rho_{eff}}}$$

$$b = \frac{\sqrt{E_{eff} \rho_{eff}}}{k_n Q}$$

This is now substituted into the equation for damped vibrations in a longitudinal bar and solved to find the amplitude of vibrations. Canceling the cross section area term A, substituting $u(x,t)=U_0 \sin(k_n x) \cdot e^{j\omega_n t}$ and $\sigma_{drive}=\sigma_p$ into the above, $$-\rho_{eff} \omega_n^2 e^{j\omega_n t} U_0 \sin(k_n x) +$$

$$j b \omega_n e^{j\omega_n t} k_n^2 U_0 \sin(k_n x) + E_{eff} e^{j\omega_n t} k_n^2 U_0 \sin(k_n x) = \frac{d\sigma_p}{dx}$$

which may be rewritten as $$U_0 \sin(k_n x) = \frac{\frac{d\sigma_{drive}}{dx}}{(-\rho_{eff} \omega_n^2 e^{j\omega_n t} + j b \omega_n e^{j\omega_n t} k_n^2 + E_{eff} e^{j\omega_n t} k_n^2)}$$

The driving stress due to the piezoelectric film is a constant value through the thickness of the piezoelectric film, g, and zero elsewhere. Thus, the slope of the driving stress may be represented as delta functions at interfaces of the piezoelectric film between the semiconductor region 2 and the driving gate 4. As per the x-axis convention shown in FIG. 1b, the piezoelectric film extends from $$x \in \left(d - \frac{g}{2}, d + \frac{g}{2}\right).$$

Thus, $$\frac{d\sigma_{drive}}{dx} = \sigma_{drive}\left[\delta\left(x - \left(d - \frac{g}{2}\right)\right) - \delta\left(x - \left(d + \frac{g}{2}\right)\right)\right]$$

Substituting this into the above equation, multiplying both sides by $\sin(k_n x)$ and integrating from $-L/2$ to $L/2$ gives:

$$\int_{-L/2}^{L/2} U_0 \sin^2(k_n x) dx =$$

$$\int_{-L/2}^{L/2} \frac{\sigma_p\left[\delta\left(x - \left(d - \frac{g}{2}\right)\right) - \delta\left(x - \left(d + \frac{g}{2}\right)\right)\right]\sin(k_n x) dx}{(-\rho_{eff}\omega_n^2 e^{j\omega_n t} + jb\omega_n e^{j\omega_n t}k_n^2 + E_{eff} e^{j\omega_n t}k_n^2)}$$

$$U_0 = \frac{2\sigma_{drive}}{Le^{j\omega_n t}(-\rho_{eff}\omega_n^2 + jb\omega_n k_n^2 + E_{eff} k_n^2)}$$

$$\left(\sin\left(k_n d - \frac{k_n g}{2}\right) - \sin\left(k_n d + \frac{k_n g}{2}\right)\right)$$

Simplifying:

$$U_0 = = \frac{2\sigma_{drive}}{Le^{j\omega_n t}(-\rho_{eff}\omega_n^2 + jb\omega_n k_n^2 + E_{eff} k_n^2)} \sin\left(\frac{k_n g}{2}\right)\cos(k_n d)$$

Sensing of Acoustic Vibrations.
Calculation of DC Current

The DC current in a field effect transistor having its source tied to ground, gate biased at $V_{GS}$ and drain biased at $V_{DS}$, with a threshold voltage $V_T$, is given by two relations. In the linear regime, when $V_{DS} \leq V_{GS} - V_T$, the current $I_{DCLin}$ is given as $$I_{DCLin} = \frac{H}{L_{channel}} \mu_n C_{piezo}\left(V_{GS} - V_T - \frac{V_{DS}}{2}\right) V_{DS}$$

In the saturation regime $V_{DS} \geq V_G - V_T$, and the current $I_{DCsat}$ is given by $$I_{DCsat} = \frac{H}{2L_{channel}} \mu_n C_{piezo}(V_{GS} - V_T)^2$$

Calculation of Threshold Voltage
a) For "Long" Bulk (i.e. Maximum Depletion Region Achieved)

In this case, the threshold voltage, $V_T$, is calculated using the formula:

$$V_T = \phi_{ms} + \phi_{sth} + \frac{Q_{dmax}}{C_{piezo}}$$

where the difference in work functions $\phi_{ms}$ between the semiconductor material and the gate material, also known as the flatband voltage, is:

$$\phi_{ms} = -\frac{W_{Si} - W_{Moly}}{q}$$

where the subthreshold voltage is given by $\phi_{sth}$ where q is elementary charge, k is the Boltzmann constant, T is the temperature, $N_A$ is the doping of the bulk silicon region and $n_i$ is the intrinsic carrier density $$\phi_{sth} = \frac{2kT}{q}\ln\left(\frac{N_A}{n_i}\right)$$

The depletion charge at maximum depletion width is given by $Q_{dmax}$, where $\in_{Si}$ is the permittivity of silicon $$Q_{dmax} = \sqrt{2\in_{Si} q N_A \phi_{sth}}$$

b) For "Short" Bulk (i.e. Fully Depleted)

As the bulk of the device may be quite short, it may be fully depleted before the maximum possible depletion depth is achieved. Hence the threshold voltage occurs when the device reaches its maximum depth of depletion layer, following which it goes into inversion. In this case, the threshold voltage is given by:

$$V_T = \phi_{ms} + \phi_s + \frac{Q_{dep}}{C_{piezo}}$$

In this scenario, the depletion charge, $Q_{dep}$, is given by $$Q_{dep} = qN_A(2d-g)$$

The surface potential, which is obtained by integrating the charge $Q_{dep}$ over the depletion region, which is the entire length of the silicon layer, to obtain the E-field, which is then integrated to obtain the potential at the surface $$\phi_s = \frac{qN_A(2d - g)^2}{2\varepsilon_{Si}} + \phi_{bg}$$

where $\phi_{bg}$ is the surface potential at the back gate 4 and is itself dependent on the back gate voltage. This is responsible for the feed-through. The AC modulation may be ignored for now, and the surface potential is calculated at the back gate for the DC bias $V_A$.

$$\phi_{bg} = \frac{-2kT}{q}\ln\left(\frac{\phi_{ms} - V_A}{\gamma\sqrt{\frac{kT}{q}}}\right)$$

where $\gamma$ is the body factor coefficient and is given by:

$$\gamma = \frac{1}{C_{piezo}}\sqrt{2\in_{Si} q N_A}$$

Piezoelectric Contribution

In a hexagonal crystal such as AlN, for an externally applied field $E_3$, dielectric constant, $\in_3$, direct piezoelectric coefficient matrix given by e and the inverse piezoelectric coefficient matrix given by d (as discussed in the previous section) and strain given by S, the electric displacement vector $D_3$ is given by $$D_3 = \epsilon_3 E_3 + d_{31}(S_1+S_2) + d_{33}S_3 = \epsilon_3 E_3 + e_{31}(S_1+S_2) + e_{33}S_3$$

Assuming that the 1-D standing wave at resonance, u(x,t), is only along the x direction, which is also the direction along which the c-axis is oriented and the 33 coefficient is relevant, i.e., assuming that there is no strain along other two directions ($S_1=S_2=0$). Thus, the above can be re-written as:

$$D_3 = \epsilon_3 E_3 + d_{33}S_3$$

Since the contribution of the externally applied electric field is already accounted for as the term $V_{GS}$ in the DC current equation for the sensing side, setting $E_3=0$ results in $$D_3 = e_{33}S_3$$

From this expression for the electric displacement, the equivalent piezoelectrically induced electric field, $E_{piezo}$ and the corresponding voltage across the piezoelectric film, $V_{piezo}$ is calculated as:

$$V_{piezo} = \int_{-d-g/2}^{-d+g/2} E_{piezo}(x) dx = -\frac{e_{33}}{\epsilon_3} \int_{-d+\frac{g}{2}}^{-d+\frac{g}{2}} S_3(x) dx$$

$$V_{piezo} = -\frac{e_{33}}{\epsilon_3} \int_{-d-\frac{g}{2}}^{-d+\frac{g}{2}} \frac{\partial u(x,t)}{\partial x} dx$$

$$= -\frac{e_{33}}{\epsilon_3} U_0 \sin(k_n x) \cdot e^{j\omega_n t}\Big|_{-d-\frac{g}{2}}^{-d+\frac{g}{2}}$$

$$V_{piezo} = -\frac{e_{33}}{\epsilon_3} U_0 \left[\sin\left(k_n\left(-d+\frac{g}{2}\right)\right) - \sin\left(k_n\left(-d-\frac{g}{2}\right)\right)\right] \cdot e^{j\omega_n t}$$

Simplifying:

$$V_{piezo} = -2\frac{e_{33}}{\epsilon_3} U_0 \cos(k_n d) \sin\left(k_n \frac{g}{2}\right) \cdot e^{j\omega_n t}$$

The transistor current in the linear regime, $I_{DCLin}$ and in saturation, $I_{DCsat}$, as seen in the previous section is given by:

$$I_{DCLin} = \frac{H}{L_{channel}} \mu_n C_{piezo}\left(V_{GS} - V_T - \frac{V_{DS}}{2}\right) V_{DS}$$

$$I_{DCsat} = \frac{H}{2L_{channel}} \mu_n C_{piezo}(V_{GS} - V_T)^2$$

The $V_{piezo}$ term contributes to an additional AC voltage on gate 6. Thus, in the linear regime, as long as the linear regime condition is satisfied with the net gate voltage ($V_{DS} \leq V_G + V_{piezo} - V_T$) the net current can be written as a sum of the DC current, $I_{DCLin}$, and an AC component, $i_{pelec}$, as $$I_{DCLin} + i_{pelecLin} = \frac{H}{L_{channel}} \mu_n C_{piezo}\left(V_{GS} + V_{piezo} - V_T - \frac{V_{DS}}{2}\right) V_{DS}$$

$$= I_{DCLin} + \frac{H}{L_{channel}} \mu_n C_{piezo} V_{piezo} V_{DS}$$

$$i_{pelecLin} = \frac{H}{L_{channel}} \mu_n C_{piezo} V_{DS} V_{piezo}$$

$$= \frac{H}{L_{channel}} \mu_n C_{piezo}\left(V_{GS} - V_T - \frac{V_{DS}}{2}\right) V_{DS} \frac{V_{piezo}}{\left(V_{GS} - V_T - \frac{V_{DS}}{2}\right)}$$

This may be expressed in terms of the DC linear regime current as:

$$i_{pelecLin} = I_{DCLin} \frac{V_{piezo}}{\left(V_{GS} - V_T - \frac{V_{DS}}{2}\right)}$$

Similarly, in the saturation regime, ($V_{DS} \geq V_G + V_{piezo} - V_T$)

$$I_{DCsat} + i_{pelecsat} = \frac{H}{2L_{channel}} \mu_n C_{piezo}(V_{GS} + V_{piezo} - V_T)^2 =$$

$$I_{DCsat} + \frac{H}{L_{channel}} \mu_n C_{piezo} V_{piezo}(V_{GS} - V_T) + \frac{H}{2L_{channel}} \mu_n C_{piezo} V_{piezo}^2$$

$$i_{pelecsat} = \frac{H}{L_{channel}} \mu_n C_{piezo} V_{piezo}(V_{GS} - V_T) + \frac{H}{2L_{channel}} \mu_n C_{piezo} V_{piezo}^2 =$$

$$\frac{H}{2L_{channel}} \mu_n C_{piezo}(V_{GS} - V_T)^2 \frac{2 V_{piezo}}{(V_{GS} - V_T)} +$$

$$\frac{H}{2L_{channel}} \mu_n C_{piezo}(V_{GS} - V_T)^2 \frac{V_{piezo}^2}{(V_{GS} - V_T)^2}$$

This may be expressed in terms of the DC saturation current as:

$$i_{pelecsat} = I_{DCsat}\left(\frac{2 V_{piezo}}{(V_{GS} - V_T)} + \frac{V_{piezo}^2}{(V_{GS} - V_T)^2}\right)$$

Piezoresistive Contribution

The standing wave along the x-direction in the resonator results in a time-dependent strain along the channel which modulates the mobility due to the piezoresistive effect. From the previous section, this may be expressed as:

$$\frac{\Delta \mu_n}{\mu_n} = \pi_{111} E_{Si} S_3(x)\Big|_{x=-d+\frac{g}{2}} = \pi_{111} E_{Si} k_n U_0 \cos\left(-k_n d + \frac{k_n g}{2}\right)$$

In the linear regime, $$I_{DCLin} + i_{presLin} = \frac{H}{L_{channel}} (\mu_n + \Delta\mu_n) C_{piezo}\left(V_{GS} - V_T - \frac{V_{DS}}{2}\right) V_{DS}$$

$$= \frac{H}{L_{channel}} \mu_n C_{piezo}\left(V_{GS} - V_T - \frac{V_{DS}}{2}\right) V_{DS}\left(1 + \frac{\Delta\mu_n}{\mu_n}\right)$$

$$= I_{DCLin} + I_{DCLin} \frac{\Delta\mu_n}{\mu_n}$$

$$i_{presLin} = I_{DCLin} \frac{\Delta\mu_n}{\mu_n}$$

$$= I_{DCLin} \pi_{111} E_{Si} k_n U_0 \cos\left(-k_n d + \frac{k_n g}{2}\right)$$

Similarly in the saturation regime, $$i_{pressat} = I_{DCsat} \frac{\Delta\mu_n}{\mu_n}$$

$$= I_{DCsat}\, \pi_{111}\, E_{Si}\, k_n\, U_0 \cos\!\left(-k_n d + \frac{k_n g}{2}\right)$$

The sign of the piezoresistive coefficient along the direction of the current determines whether this contribution is $\pi/2$ or $3\pi/2$ phase-shifted with respect to the piezoelectric contribution.

Capacitive Contribution

Apart from the piezoelectric contribution to the output AC current, an AC current is present resulting from the change in the capacitance of the piezoelectric film. An insulating piezoelectric film forms a capacitor which squeezes and expands due to the acoustic wave, and this results in an additional AC current. Thus, this current is positive when the capacitance increases, i.e., when the piezoelectric film is compressed. Calculating the capacitance at DC, $C_{piezo}$, and at the maximum amplitude of resonance, $C'_{piezo}$, where the piezoelectric film expands to thickness $g+\Delta g$, $$C_{piezo} = \frac{\varepsilon_0\, k_{piezo}}{g}$$

$$C'_{piezo} = \frac{\varepsilon_0\, k_{piezo}}{g + \Delta g}$$

Thus, the change in capacitance, $\Delta C_{piezo}$, assuming $\Delta g$ is small, is given by:

$$\Delta C_{piezo} =$$
$$C'_{piezo} - C_{piezo} = \frac{\varepsilon_0\, k_{piezo}}{g} - \frac{\varepsilon_0\, k_{piezo}}{g + \Delta g} = \frac{\varepsilon_0\, k_{piezo}}{g + \Delta g}\frac{\Delta g}{g} \approx \frac{\varepsilon_0\, k_{piezo}\Delta g}{g^2}$$

The net increase in the thickness of the piezoelectric film, $\Delta g$, is calculated by integrating the strain function over the thickness of the film $$\Delta g = \int_{-d-\frac{g}{2}}^{-d+\frac{g}{2}} \frac{du(x)}{dx}\, dx = U_0 e^{j\omega_n t} \sin(k_n x)\Big|_{-d-\frac{g}{2}}^{-d+\frac{g}{2}}$$

$$\Delta g = U_0 e^{j\omega_n t}\left\{\sin\!\left(k_n\!\left(-d+\frac{g}{2}\right)\right) - \sin\!\left(k_n\!\left(-d-\frac{g}{2}\right)\right)\right\}$$

Simplifying:

$$\Delta g = 2\, U_0 e^{j\omega_n t}\, \sin\!\left(\frac{k_n g}{2}\right)\cos(k_n d)$$

$$\Delta C_{piezo} = \frac{2\, \varepsilon_0\, k_{piezo}}{g^2} U_0 e^{j\omega_n t}\, \sin\!\left(\frac{k_n g}{2}\right)\cos(k_n d)$$

In the linear regime, $$I_{DCLin} + i_{caplin} = \frac{H}{L_{channel}}\mu_n(C_{piezo} + \Delta C_{piezo})\!\left(V_{GS} - V_T - \frac{V_{DS}}{2}\right)V_{DS}$$
$$= \frac{H}{L_{channel}}\mu_n C_{piezo}\!\left(V_{GS} - V_T - \frac{V_{DS}}{2}\right)V_{DS}\!\left(1 + \frac{\Delta C_{piezo}}{C_{piezo}}\right)$$
$$= I_{DCLin} + I_{DCLin}\frac{\Delta C_{piezo}}{C_{piezo}}$$

$$i_{caplin} = I_{DCLin}\frac{\Delta C_{piezo}}{C_{piezo}} = I_{DCLin}\frac{2\,\varepsilon_0\,k_{piezo}}{g^2}U_0 e^{j\omega_n t}\,\sin\!\left(\frac{k_n g}{2}\right)\cos(k_n d)$$

Similarly in the saturation regime, $$i_{capsat} = I_{DCsat}\frac{\Delta C_{piezo}}{C_{piezo}} = I_{DCsat}\frac{2\,\varepsilon_0\,k_{piezo}}{g^2}U_0 e^{j\omega_n t}\,\sin\!\left(\frac{k_n g}{2}\right)\cos(k_n d)$$

The total modulation current in the linear or the saturation regime is thus given by summing these three contributions in that regime:

$$i_{out} = i_{pelec} + i_{pres} + i_{cap}$$

The piezoelectric and capacitive contributions are in-phase with one another. The piezoresistive contribution is $\pi/2$ out of phase with the piezoelectric and capacitive contributions. This phase difference may be corrected with post-processing and/or minimized with design.

The relative contributions of the different physical mechanisms to driving and sensing will be discussed using an exemplary design.

Example Design

A design example will now be discussed in which the piezoelectric electromechanical device 1 has exemplary dimensions and operating parameters. These parameters are described solely by way of example, as any suitable dimensions and operating parameters may be used. FIGS. 5-9 show plots illustrating the device performance for an electromechanical transistor 1 and passive piezoelectric electromechanical device 11 with the exemplary dimensions and parameters listed below, unless stated otherwise. In FIGS. 5-9, the performance of piezoelectric electromechanical transistor 1 is plotted as a solid curve and the performance of passive piezoelectric electromechanical device 11 is plotted using a dashed curve.

Exemplary Dimensions and Parameters

| Parameter | Value |
|---|---|
| $V_D$ | 1 V |
| $V_G$ | 5 V |
| $V_A$ | −5 V |
| $v_{ac}$ | 0.1 V |
| g | $10^{-7}$ m or 100 nm |
| $Q_{33}$ | 0.92 m$^4$/C$^2$ |
| $E_{Si}$ | $170 * 10^9$ N/m$^2$ |
| $E_{piezo}$ | $135 * 10^9$ N/m$^2$ |
| $E_{Mo}$ | $329 * 10^9$ N/m$^2$ |
| $L_{elec}$ | $2 * 10^{-7}$ m or 200 nm |
| $\rho_{Si}$ | 2330 kg/m$^3$ |
| $\rho_{piezo}$ | 3200 kg/m$^3$ |
| $\rho_{Mo}$ | 10280 kg/m$^3$ |
| $\epsilon_0$ | $8.85 * 10^{-12}$ F/m |
| $k_{piezo}$ | 8.9 |
| $L_{channel}$ | 500 nm |
| H | 1 um |
| W | $L_{gate}$ + 2 μm |
| $\mu_n$ | $100 * 10^{-4}$ V/m$^2$s |
| $E_{Si}$ | 11.6 |
| q | $1.6 * 10^{-19}$ C |
| $N_A$ | $10^{20}$/m$^3$ |
| k | $1.38 * 10^{-23}$ J/K |
| T | 300 K |
| $n_i$ | $1.08 * 10^{16}$/m$^3$ |
| $\pi_{111}$ | $45 * 10^{-11}$ m$^2$/N |

-continued

| Parameter | Value |
|---|---|
| Q | 1000 |
| $f_n$ | 5 GHz |

Piezoelectric Coefficients for AlN $$e = \begin{bmatrix} 0 & 0 & 0 & 0 & -0.48 & 0 \\ 0 & 0 & 0 & -0.48 & 0 & 0 \\ -0.58 & -0.58 & 1.55 & 0 & 0 & 0 \end{bmatrix} (C/m^2)$$

$$d = \begin{bmatrix} 0 & 0 & 0 & 0 & -4 & 0 \\ 0 & 0 & 0 & -4 & 0 & 0 \\ -1.98 & -1.98 & 4 & 0 & 0 & 0 \end{bmatrix} 10^{-12} (C/N)$$

Electromechanical Drive

Using the values from the table of exemplary parameters, the relative amplitude of the piezoelectric and electrostrictive stress (AC) is given by:

$$\frac{\sigma_p}{\sigma_e} \approx 150$$

Thus, the piezoelectric stress is more than two orders of magnitude greater than that due to electrostriction, hence the latter is assumed to be insignificant in subsequent analysis.

Electromechanical Sensing

For a gate voltage $V_G$ of 5V, threshold voltage <1V and drain voltage of 1V, the transistor may be operated in saturation. In this case, on the sensing side, the relative magnitude of the piezoelectric and the piezoresistive contribution in saturation is given by:

$$\frac{i_{pelecsat}}{i_{pressat}} \approx 12$$

In the linear regime, the relative amplitude is given by:

$$\frac{i_{peleclin}}{i_{preslin}} = \frac{V_{piezo} \left(V_{GS} - V_T - \frac{V_{DS}}{2}\right)}{\pi_{111} E_{Si} k_n U_0 \cos\left(-k_n d + \frac{k_n g}{2}\right)}$$

and the relative magnitude depends on the values set for $V_{GS}$ and $V_{DS}$. Thus for now it is assumed that both the piezoelectric and piezoresistive effects have a non-negligible contribution to the output current.

The relative magnitude of the piezoresistive and the capacitive contribution in the saturation as well as the linear regimes are given by:

$$\frac{i_{pres}}{i_{cap}} \approx 10^5$$

Thus the capacitive contribution can be ignored while setting up the equations related to sensing signals from the device.

Equivalent Circuit Model

Figure 2:
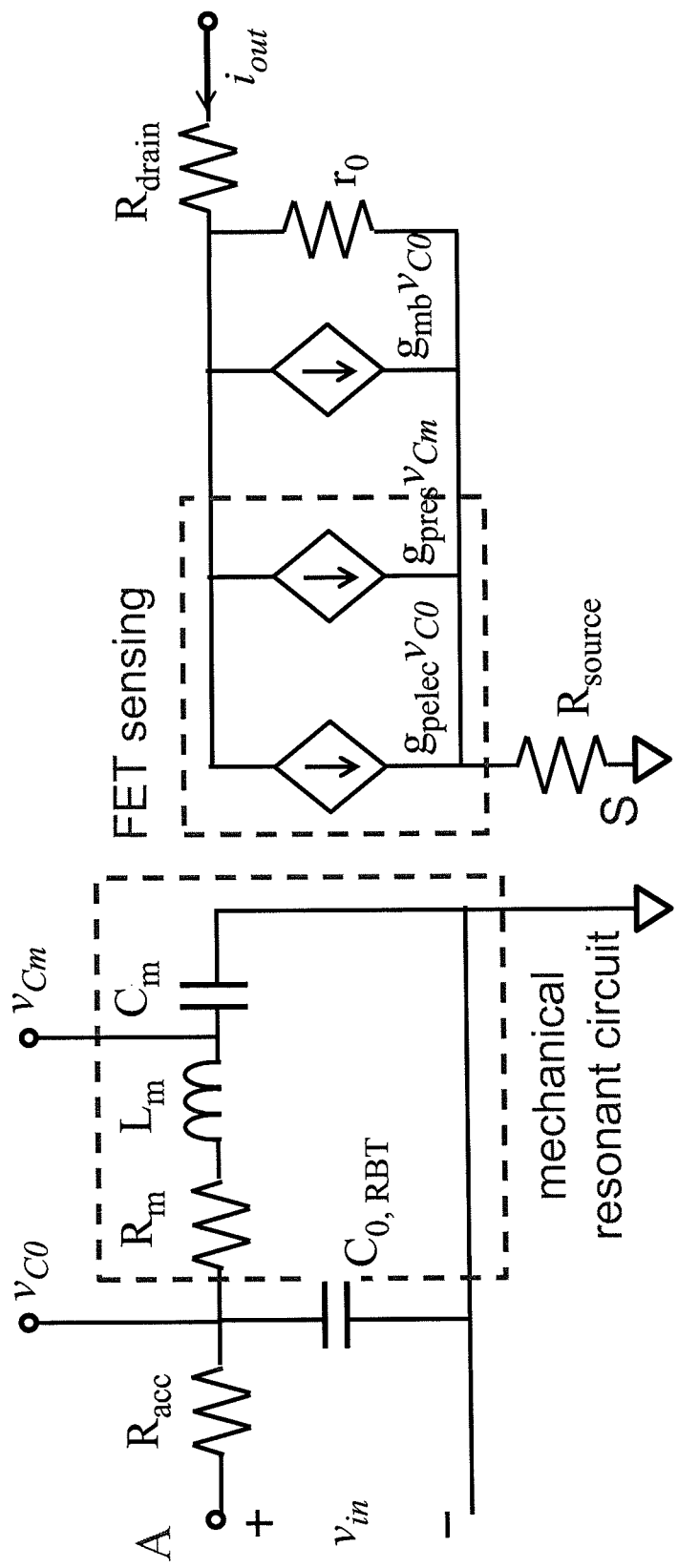
FIG. 2 shows an equivalent circuit model for the piezoelectric electromechanical transistor.

A small-signal equivalent circuit may be developed based on the resonance frequency and quality factor of the piezoelectric electromechanical transistor 1 (FIG. 2). The model combines a traditional transistor pi-model with the equivalent RLC circuit of the bulk-acoustic resonator. Unlike traditional 2-port resonators with passive driving and sensing, the piezoelectric electromechanical transistor 1 drive and sense are not symmetric. To accommodate this, the RLC components in the model are equivalent to those of a one-port passive device. The FET sensing is represented by the electromechanical transconductance $g_{pres}$ contributed by the piezoresistive sensing component and the transconductance $g_{pelec}$ from the piezoelectric effect. These are the π/2 shifted with respect another in phase and together result in the high-Q AC output current. The signal floor is limited by the back-gate feedthrough modeled by $g_{mb}$.

Performance Trends

One can set up equations to plot the total AC output current $i_{out}$ vs time. Two of the control parameters are $V_{GS}$ and $V_{DS}$. The effect of changing these control parameters on the AC output current will be discussed.

A non-linearity for small values of the gate voltage is believed to occur because the net gate voltage, which is given by $V_{GS}+V_{piezo}$ switches between the saturation, linear and sub-threshold regimes. For the net gate voltage to stay completely in the saturation regime, $V_{GS}-V_{piezo}-V_T>V_{DS}$. For a threshold voltage $V_T=0.7V$, $V_{DS}=1V$, and $V_{piezo}=1V$, the DC gate bias $V_{GS} \geq 2.7V$. Higher gate bias voltages lead to larger AC output current as the DC bias current $I_{DCsat}$ increases with $V_{GS}$ in saturation, and the piezoelectric contribution to the AC output current also increases linearly with $V_{GS}$ following the transistor equations:

$$I_{DCsat} = \frac{H}{2L_{channel}} \mu_n C_{piezo} (V_{GS} - V_T)^2$$

$$i_{pelecsat} = \frac{H}{L_{channel}} \mu_n C_{piezo} V_{piezo} (V_{GS} - V_T) + \frac{H}{2L_{channel}} \mu_n C_{piezo} V_{piezo}^2$$

Thus, the higher the gate voltage, the higher the DC as well as AC output current, which leads to a higher transconductance and lower insertion loss for the device. The upper limit on this is that a large $V_{GS}$ will lead to a large leakage current through the piezoelectric film and ultimately may result in its breakdown.

For small values of $V_{DS}$ (<3.3V), the condition $V_{GS}-V_{piezo}-V_T>V_{DS}$ holds for the known values of the $V_{GS}=5V$, $V_{piezo}=1V$ and $V_T=0.7$ V and the transistor remains in saturation and no dependence on $V_{DS}$ is observed as expected from the transistor equations. For intermediate values of $V_{DS}$ (between 3.3 V and 5.3 V), the transistor switches back and forth between the saturation and linear regimes when $V_{piezo}$ is near its peak values and a distortion in the output waveform is observed. For high values of $V_{DS}$, the condition $V_{GS}-V_{piezo}-V_T<V_{DS}$ holds, pushing the transistor into the linear regime where the dominant component of the AC output current, $i_{peleclin}$, is dependent on $V_{DS}$ through the relation:

$$i_{peleclin} = \frac{H}{L_{channel}} \mu_n C_{piezo} V_{DS} V_{piezo}$$

Thus, for a sinusoidally varying output AC current the transistor should remain in the saturation or linear regimes.

However, for a fixed drain voltage, the piezoelectrically modulated AC current in the linear regime is smaller than that in the saturation regime if:

$$i_{pelecsat} = \frac{H}{L_{channel}}\mu_n C_{piezo} V_{piezo}(V_{GS}-V_T) + \frac{H}{2L_{channel}}\mu_n C_{piezo} V_{piezo}^2 > \frac{H}{L_{channel}}\mu_n C_{piezo} V_{DS} V_{piezo}$$

when $$(V_{GS}-V_T)+\frac{V_{piezo}}{2}>V_{DS}$$

Thus, one can conclude that the output signal may be maximized by applying high gate and drain voltages to the device, but the ability to apply high gave or drain voltages may be limited by the application.

Figure 3:
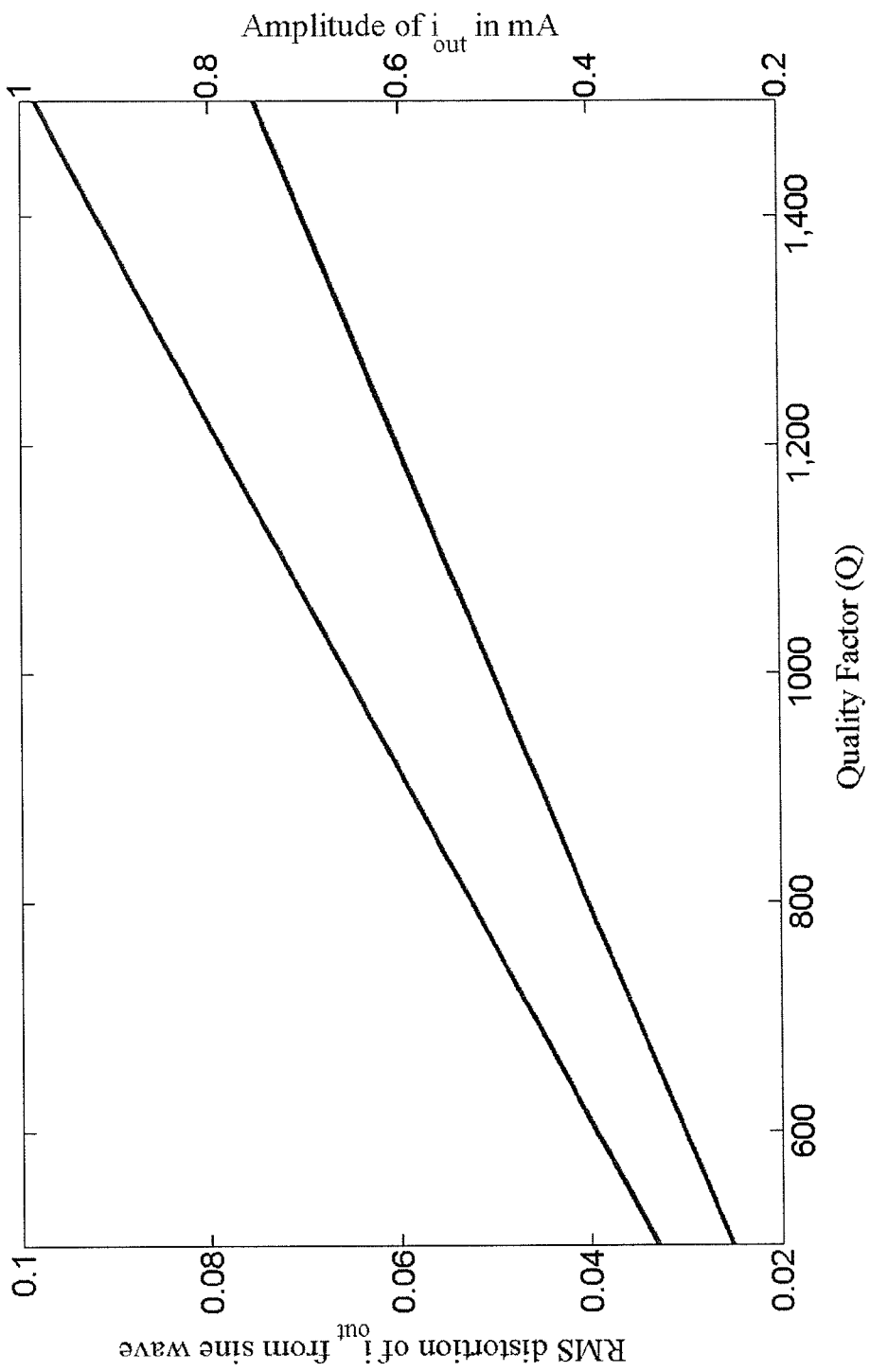
FIG. 3 shows a plot of $i_{out}$ and the RMS (root mean square) distortion of $i_{out}$ as a function of the quality factor.

A plot of the AC output current, $i_{out}$ and RMS distortion of $i_{out}$ as a function of the quality factor is shown in FIG. 3. The increasing amplitude of $i_{out}$ with Q is due to the fact that a larger Q value means that the amplitude of vibrations at resonance is amplified to a larger degree, leading to a larger $i_{out}$ due to both piezoelectric and piezoresistive effects. FIG. 3 also shows that the distortion of the output waveform from a sinusoidal shape becomes more severe with increasing Q, which may create a tradeoff for device design. The quality factor is a variable limited by several loss mechanisms, including, but not limited to anchor loss, thermoelastic damping and phonon-phonon scattering and can be improved by using suitable materials, design and fabrication techniques (e.g., Molecular Beam Epitaxy).

$L_{channel}$ may be chosen to be small, but may be limited by fabrication tolerances. A larger length for $L_{channel}$ may, however, be advantageous for reducing spurious modes of vibration. The thickness of the piezoelectric film (g) as well as its position from the center of the device (d) are both parameters that may be optimized for specific resonator performance characteristics.

Comparison of Transistor Sensing and Passive Sensing

Figure 4A:
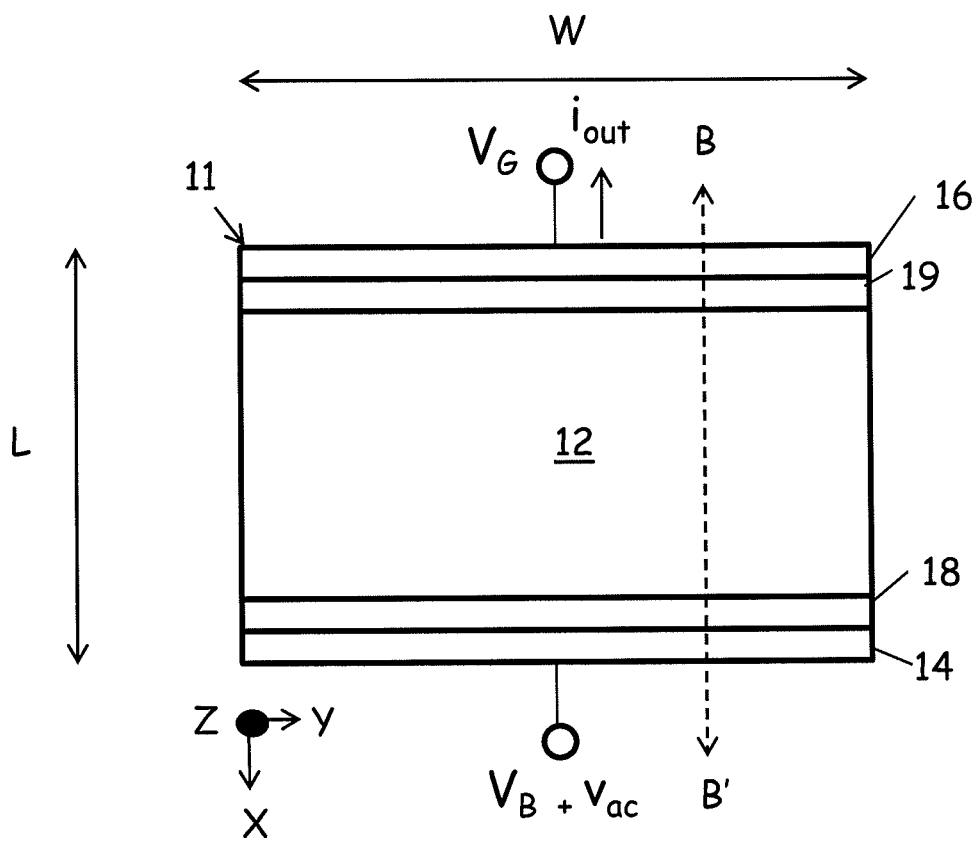
FIG. 4a shows a top view of a passive piezoelectric electromechanical device, according to some embodiments.
Figure 4B:
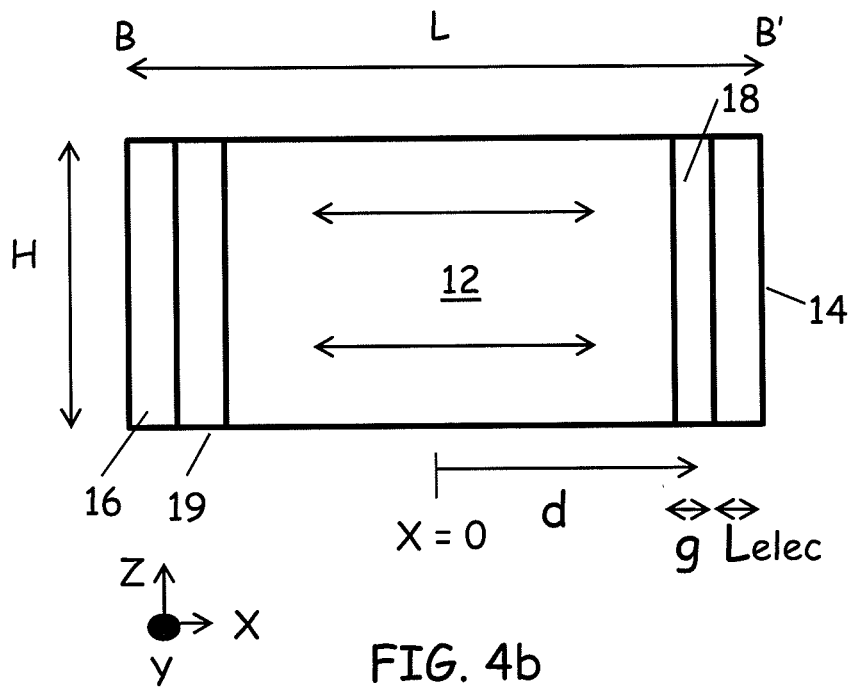

To analyze the effect of sensing using a transistor, a passive piezoelectric electromechanical device will be discussed having a structure similar to that of the piezoelectric electromechanical transistor 1 shown in FIGS. 1a and 1b. FIG. 4a shows an example of a passive piezoelectric electromechanical device 11, according to some embodiments. FIG. 4b shows a cross-section of the passive piezoelectric electromechanical device 11 along the line B-B' of FIG. 4a. As shown in FIGS. 4a and 4b, passive piezoelectric electromechanical device 11 includes a semiconductor region 12, a first gate 14, a second gate 16, a first piezoelectric region 18 and a second piezoelectric region 19. A difference between the passive piezoelectric electromechanical device 11 and the piezoelectric electromechanical transistor 1 is that the passive piezoelectric electromechanical device 11 does not use a transistor in a semiconductor region of the resonator to produce an amplified output signal.

In some embodiments, the passive piezoelectric electromechanical device 11 can be operated by applying a actuation voltage of $V_A+v_{ac}$ to the driving gate 14, the semiconductor region 12 can be grounded and a DC voltage $V_G$ can be applied to the sensing gate 16.

For the passive piezoelectric electromechanical device 11, the effective spring constant, $k_{eff}$, is $$k_{eff}=\frac{E_{eff}WH}{L}$$

Where the effective Young's modulus, $E_{eff}$, is determined as $$E_{eff}=\frac{L}{\frac{2L_{Mo}}{E_{Mo}}+\frac{2L_{piezo}}{E_{piezo}}+\frac{L_{Si}}{E_{Si}}}$$

Thus, $$k_{eff}=\frac{WH}{\frac{2L_{Mo}}{E_{Mo}}+\frac{2L_{piezo}}{E_{piezo}}+\frac{L_{Si}}{E_{Si}}}$$

This equation can be used to determine an effective mass for the system, $M_{eff}$, which is related to the effective spring constant as $$k_{eff}=\omega_n^2 M_{eff}$$

For the passive piezoelectric electromechanical device 11, the sensing current is the result of the time-dependent charge that accumulates at the piezoelectric film as a result of its vibrations. For an externally applied field $E_3$, dielectric constant, $\in_3$, direct piezoelectric coefficient matrix given by e and the inverse piezoelectric coefficient matrix given by d (as discussed in the previous section) and strain given by S, the electric displacement vector $D_3$ is given by $$D_3=\in_3 E_3+e_{31}(S_1+S_2)+e_{33}S_3=\in_3 E_3+e_{31}(S_1+S_2)+e_{33}S_3$$

Assuming a 1-D standing wave at resonance and $S_1=S_2=0$, and ignoring the externally applied DC field $E_3$ the above can be re-written as, $$D_3=e_{33}S_3$$

As calculated previously, the corresponding voltage across the piezoelectric film, $V_{piezo}$ is given as:

$$V_{piezo}=-2\frac{e_{33}}{\varepsilon_3}U_0\cos(k_n d)\sin\left(k_n\frac{g}{2}\right)\cdot e^{j\omega_n t}$$

The induced charge at the gate, $Q_{piezo}$, is calculated using the capacitive equation $$Q_{piezo}=C_{piezo}V_{piezo}$$

$$Q_{piezo}=-2\frac{WH\varepsilon_3}{g}\frac{e_{33}}{\varepsilon_3}U_0\cos(k_n d)\sin\left(k_n\frac{g}{2}\right)\cdot e^{j\omega_n t}$$

The output current $i_{out}$ is given by $$i_{out}=\frac{dQ_{piezo}}{dt}=-j\omega_n\frac{2WH}{g}e_{33}U_0\cos(k_n d)\sin\left(k_n\frac{g}{2}\right)\cdot e^{j\omega_n t}$$

The equivalent motional impedance $R_X$ is given by $$R_X = \frac{v_{ac}}{i_{out}}$$

The equivalent motional inductance $L_X$ and capacitance $C_X$ is calculated so that the resonator may be simulated as an equivalent RLC circuit over a range of frequencies. The transduction efficiency η which is related to the motional impedance $R_X$ and the effective mass $M_{eff}$ as $$\eta^2 = \frac{M_{eff}\omega_n}{R_X Q}$$

The $L_X$ and $C_X$ are:

$$C_X = \frac{\eta^2}{k_{eff}}$$

$$L_X = \frac{M_{eff}}{\eta^2}$$

The performance of piezoelectric electromechanical transistor 1 will now be described and compared with that of the passive piezoelectric electromechanical device 11.

Figure 5:
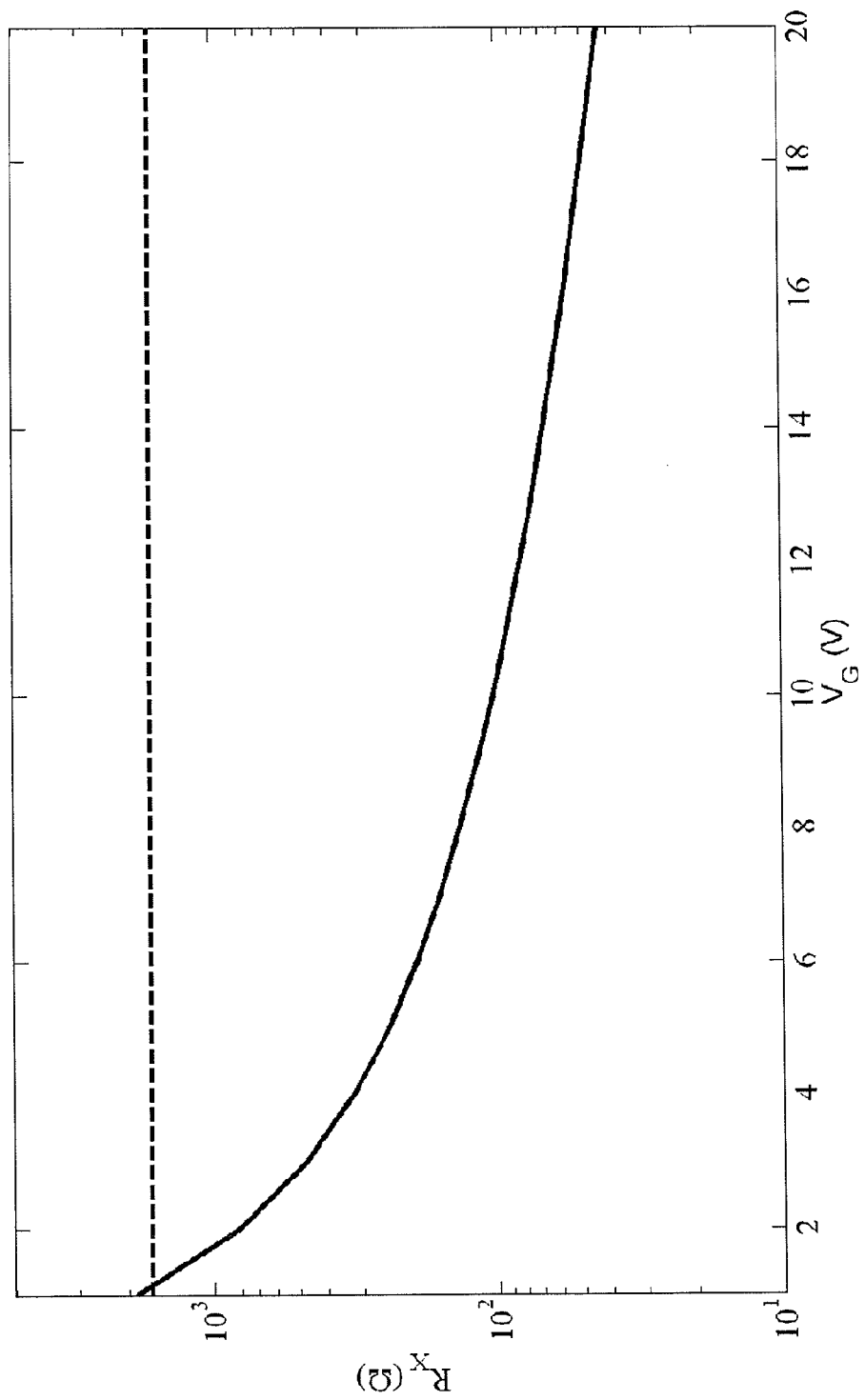
FIGS. 5-9 show plots illustrating the device performance for a piezoelectric electromechanical transistor 1 and passive piezoelectric electromechanical device 11 with exemplary dimensions and parameters as described below.

FIG. 5 shows a plot of the motional impedance $R_X$ as a function of the gate voltage $V_{GS}$. As the gate voltage $V_{GS}$ does not affect the impedance of the passive piezoelectric electromechanical device 11, one can see that its $R_X$ is constant (dashed line). On the other hand, for the piezoelectric electromechanical transistor 1, $R_X$ drops sharply with increasing gate voltage $V_{GS}$ and can reach very low values (~20Ω) around 20V (solid curve). Thus, the piezoelectric electromechanical transistor 1 has a lower motional impedance than the passive piezoelectric electromechanical device 11 at higher values of gate voltage.

Figure 6:
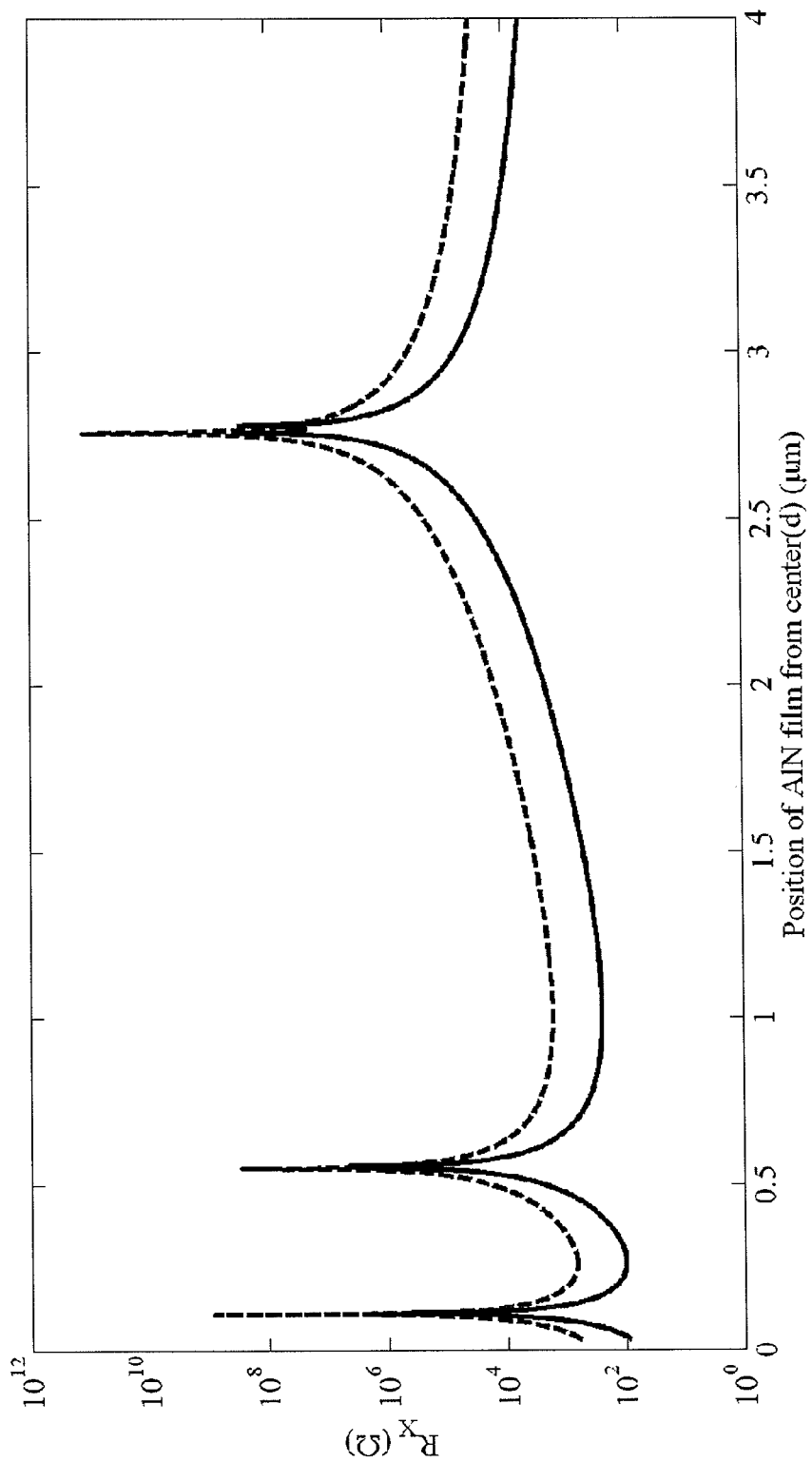

FIG. 6 shows a plot of $R_X$ as a function of the position of the piezoelectric films from the center of the device (d) for a device operating in the third harmonic n=3 for devices having a 100 nm thick AlN piezoelectric film, operation at 5 GHz, and a gate voltage of 5 V. The number of peaks is determined by the number of harmonics at which the device is resonating.

The $R_X$ of the piezoelectric electromechanical transistor 1 is about an order of magnitude lower than that of the passive piezoelectric electromechanical device 11 when the film position is selected to minimize $R_X$. The amplitude of the AC output current as well as the impedance $R_X$ does not change monotonically with the piezoelectric film position with respect to the center of the device. In this example, an excellent $R_X$ occurs at d~250 nm.

Figure 7:
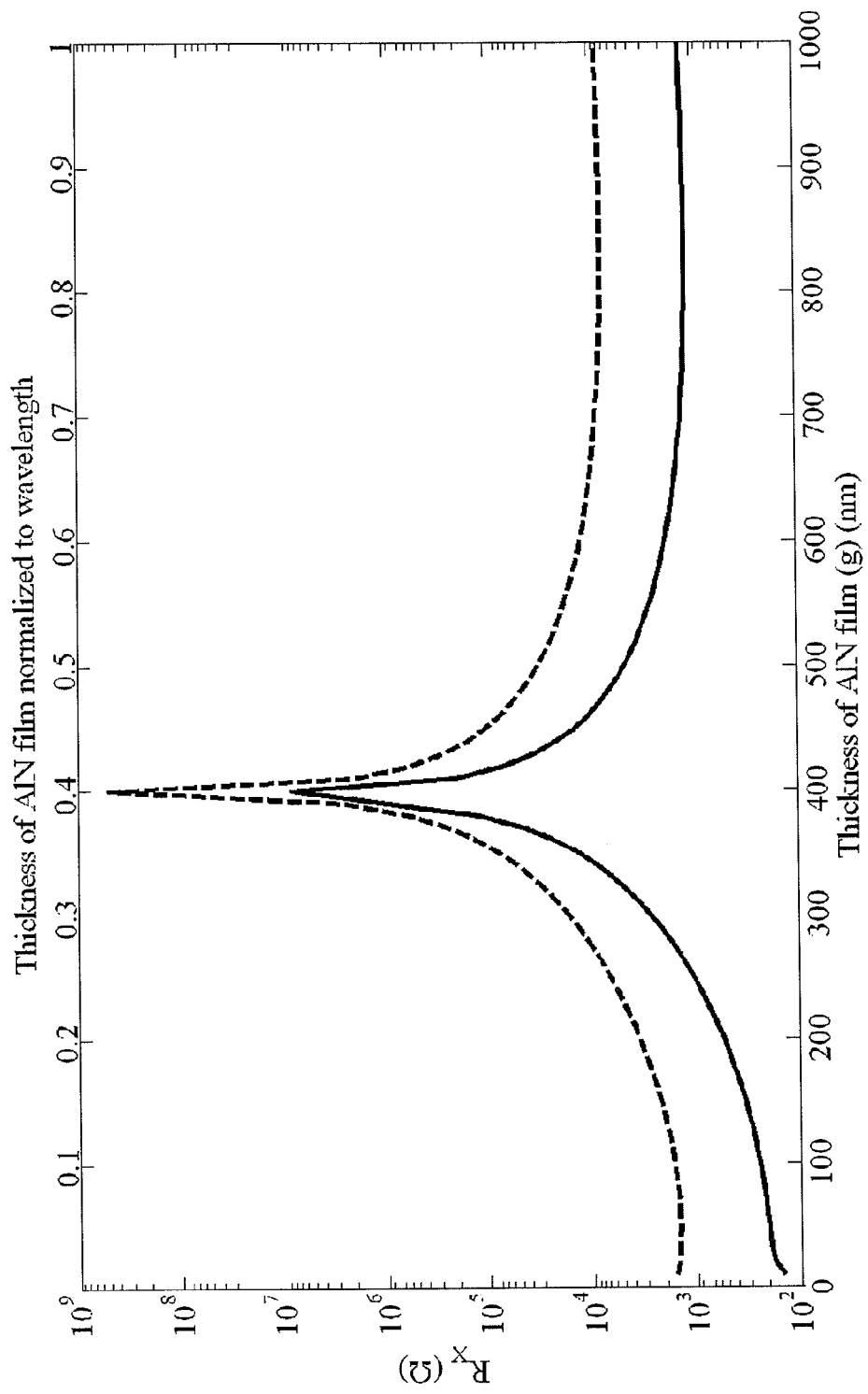

Next, the effect of the piezoelectric film thickness is described to illustrate how $R_X$ can be decreased. FIG. 7 shows a plot of $R_X$ as a function of the thickness of the piezoelectric films (g) and thickness normalized to the wavelength (λ) for a device operating in the third harmonic n=3 at a frequency of 5 GHz for both piezoelectric electromechanical transistor 1 and a passive piezoelectric electromechanical device. In this example, the frequency is held constant at 5 GHz while changing the thickness of the film. For these thicknesses, the piezoelectric electromechanical transistor 1 has approximately an order of magnitude lower $R_X$ than that of the passive piezoelectric electromechanical device. From this plot, one may also infer that the piezoelectric film thickness may be chosen to be as small as possible in order to obtain the smallest possible motional impedance.

Figure 8:
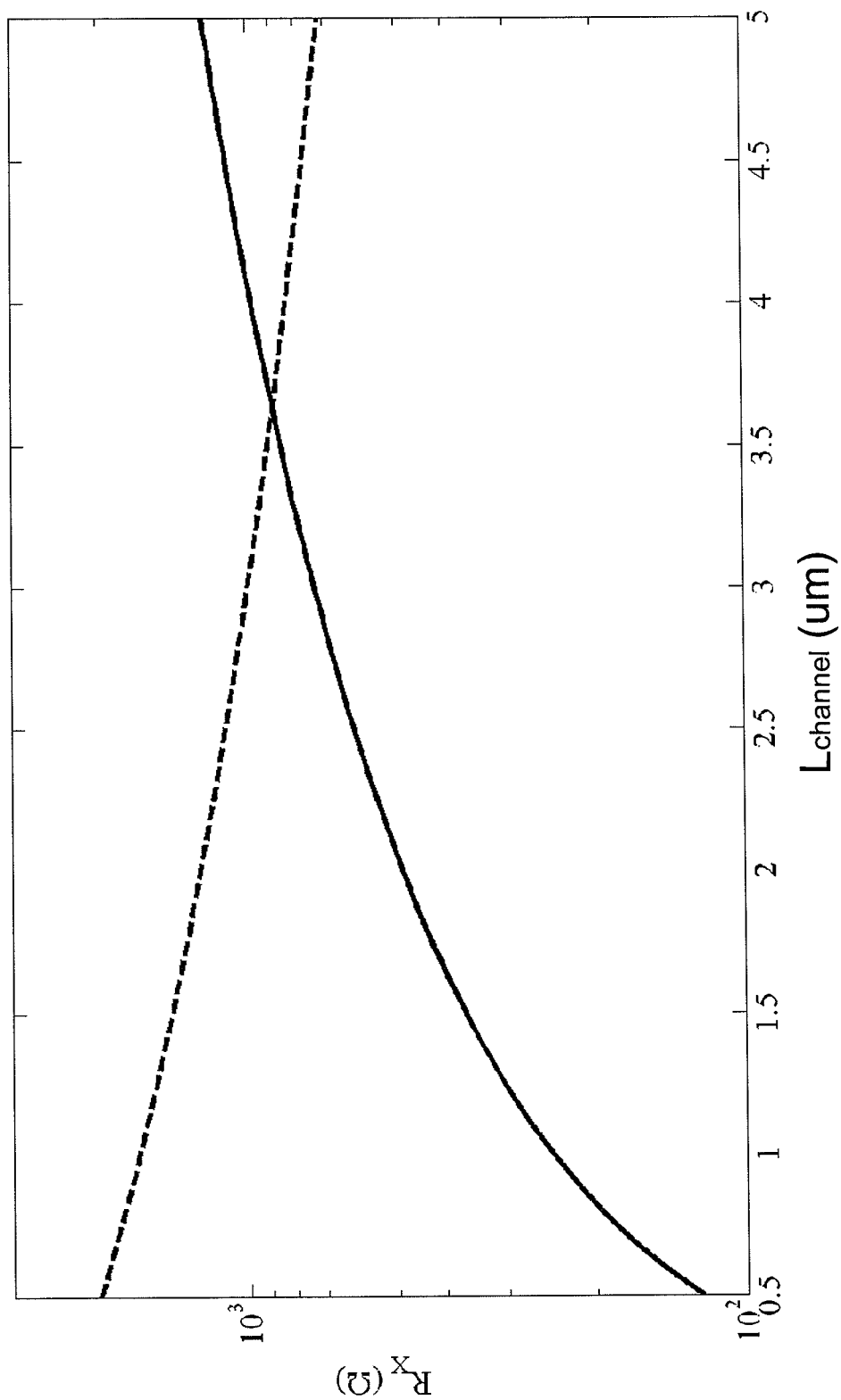

FIG. 8 shows a plot of $R_X$ as a function of $L_{channel}$ for width W=$L_{channel}$+2 μm for the piezoelectric electromechanical transistor 1 and for the passive piezoelectric electromechanical device 11 operating in the third harmonic n=3. For piezoelectric electromechanical transistor 1, increasing the channel length reduces the transistor DC current. Thus, the AC output current $i_{out}$ drops and the $R_X$ increases. On the other hand, increasing $L_{channel}$ causes an increase in the effective sensing area of the passive piezoelectric electromechanical device, thus lowering its $R_X$.

Figure 9:
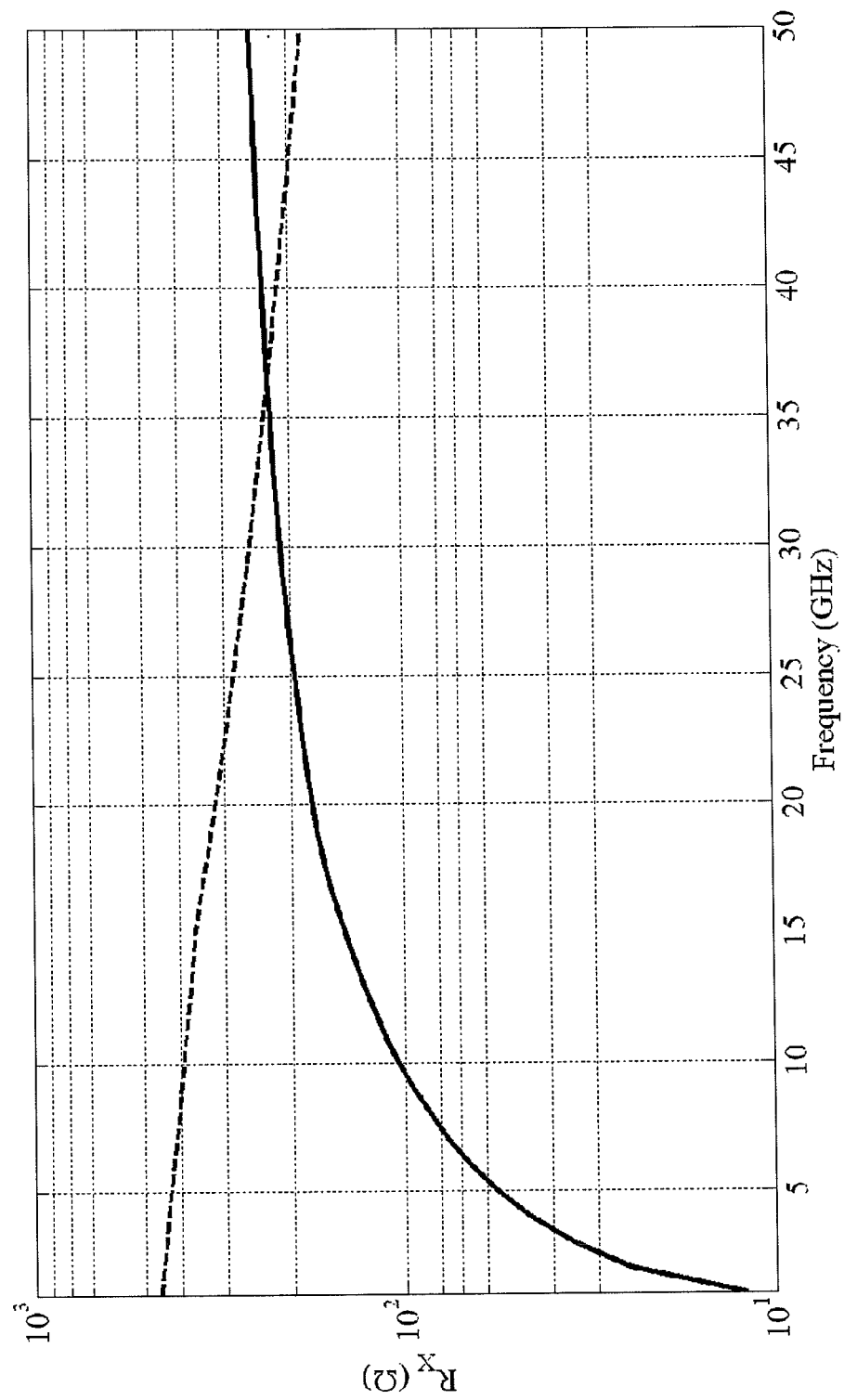

FIG. 9 shows a plot of $R_X$ as a function of the frequency for piezoelectric electromechanical transistor 1 and for a passive piezoelectric electromechanical device 11 (operating in the third harmonic n=3 with 50 nm thick AlN films for a film position optimized for low $R_X$ between 30 nm and 4 um from the center of the resonator). As shown in FIG. 8, the piezoelectric electromechanical transistor 1 has a lower $R_X$ than that of the passive piezoelectric electromechanical device 11 for frequencies below about 36 GHz.

Additional Embodiment

Figure 10:
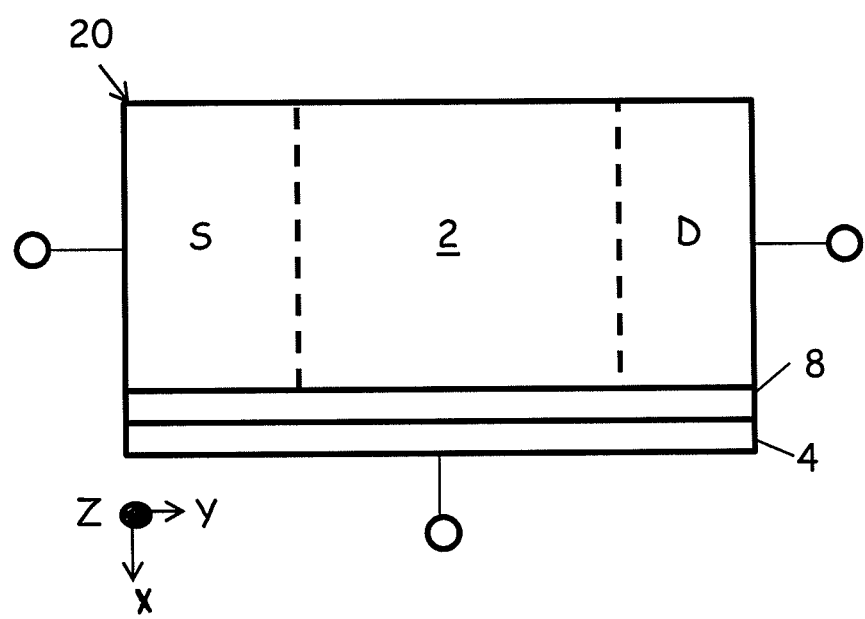
FIG. 10 shows an example of a piezoelectric electromechanical transistor having a single gate, according to another embodiment.

FIG. 10 shows an example of a piezoelectric electromechanical transistor 20 having a single gate, according to another embodiment. As shown in FIG. 10, piezoelectric electromechanical transistor 20 includes a semiconductor region 2, gate 4 and piezoelectric region 8. As with piezoelectric electromechanical transistor 1 shown in FIG. 1*a*, gate 4 may be used as a driving gate that causes piezoelectric actuation of the device 20. Device 20 may use a sensing technique different from that described by way of example for piezoelectric electromechanical transistor 1. As an example, gate 4 may be used as both the driving gate and the sensing gate of the piezoelectric electromechanical transistor 20.

Application Examples

Microelectromechanical resonators provide a small size, low cost and low-power alternative to traditional LC tanks, which makes them attractive candidates which can keep pace with the miniaturization trends of the wireless communication industry. The piezoelectric electromechanical transistors described herein offer a low impedance, small footprint device that may be used with GHz-frequency transceiver circuitry as a low impedance high-Q component. In microprocessor technology, small-size silicon-based electromechanical resonators can provide synchronized low power clocking arrays with reduced jitter and skew, allowing the technology to scale to high frequencies with high-precision clocking.

Additional Aspects

Various aspects of the present invention may be used alone, in combination, or in a variety of arrangements not specifically discussed in the embodiments described in the foregoing description and is therefore not limited in its application to the details and arrangement of components set forth in the foregoing description or illustrated in the drawings. For example, aspects described in one embodiment may be combined in any manner with aspects described in other embodiments.

Also, the invention may be embodied as a method, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

What is claimed is:

1. A piezoelectric electromechanical transistor, comprising:
    a semiconductor region in which are formed first and second terminals of the piezoelectric electromechanical transistor;
    a gate; and
    a piezoelectric region between the gate and the semiconductor region, wherein the piezoelectric region is configured to induce a change in strain of the semiconductor region in response to a signal applied to the gate,
    wherein the semiconductor region is structured to establish a standing wave of vibration in the piezoelectric electromechanical transistor in response to the signal applied to the gate.

2. The piezoelectric electromechanical transistor of claim 1, wherein the first terminal comprises a source region and the second terminal comprises a drain region.

3. The piezoelectric electromechanical transistor of claim 2, wherein the semiconductor region comprises a region between the source region and the drain region having a doping different from that of the source region and the drain region.

4. The piezoelectric electromechanical transistor of claim 1, wherein the semiconductor region comprises silicon.

5. The piezoelectric electromechanical transistor of claim 1, wherein the gate comprises a metal or a semiconductor.

6. The piezoelectric electromechanical transistor of claim 1, wherein the piezoelectric region is formed on a sidewall of the semiconductor region.

7. The piezoelectric electromechanical transistor of claim 1, wherein the piezoelectric region contacts the gate and the semiconductor region.

8. The piezoelectric electromechanical transistor of claim 1, wherein the piezoelectric region comprises aluminum nitride.

9. The piezoelectric electromechanical transistor of claim 1, wherein the gate is a first gate and the piezoelectric electromechanical transistor further comprises a second gate.

10. The piezoelectric electromechanical transistor of claim 9, further comprising:
    a second piezoelectric region between the semiconductor region and the second gate.

11. The piezoelectric electromechanical transistor of claim 1, wherein the piezoelectric electromechanical transistor is configured to vibrate in a bulk acoustic wave mode of vibration.

12. The piezoelectric electromechanical transistor of claim 1, wherein the piezoelectric electromechanical transistor is configured to vibrate in a flexural mode, a breathing mode, a wine glass mode, and/or a shear mode of vibration.

13. The piezoelectric electromechanical transistor of claim 1, wherein the semiconductor region has a cuboid shape.

14. The piezoelectric electromechanical transistor of claim 1, wherein the piezoelectric electromechanical transistor is configured to vibrate along a direction perpendicular to a direction of current flow in the semiconductor region.

15. The piezoelectric electromechanical transistor of claim 1, wherein the gate drives the piezoelectric electromechanical transistor to resonate at a frequency of at least 100 MHz.

16. The piezoelectric electromechanical transistor of claim 1, wherein the gate is biased at a DC bias voltage.

17. A piezoelectric electromechanical transistor, comprising:
    a semiconductor region in which are formed first and second terminals of the piezoelectric electromechanical transistor;
    a gate; and
    a piezoelectric region between the gate and the semiconductor region,
    wherein a signal is produced at the first terminal at least partially based on a change in strain of the semiconductor region,
    wherein the semiconductor region is structured to establish a standing wave of vibration in the piezoelectric electromechanical transistor in response to a signal applied to the gate.

18. The piezoelectric electromechanical transistor of claim 17, wherein the first terminal comprises a source region and the second terminal comprises a drain region.

19. The piezoelectric electromechanical transistor of claim 18, wherein the semiconductor region comprises a region between the source region and the drain region having a doping different from that of the source region and the drain region.

20. The piezoelectric electromechanical transistor of claim 17, wherein the semiconductor region comprises silicon.

21. The piezoelectric electromechanical transistor of claim 17, wherein the gate comprises a metal or a semiconductor.

22. The piezoelectric electromechanical transistor of claim 17, wherein the piezoelectric region is formed on a sidewall of the semiconductor region.

23. The piezoelectric electromechanical transistor of claim 17, wherein the piezoelectric region contacts the gate and the semiconductor region.

24. The piezoelectric electromechanical transistor of claim 17, wherein the piezoelectric region comprises aluminum nitride.

25. The piezoelectric electromechanical transistor of claim 17, wherein the semiconductor region has a cuboid shape.

26. The piezoelectric electromechanical transistor of claim 17, wherein the piezoelectric electromechanical transistor is configured to resonate at a frequency of at least 100 MHz.

27. A method, comprising:
    providing a first signal to a gate of a transistor to induce a change in strain of a semiconductor region using the piezoelectric effect, wherein providing the first signal to the gate produces a standing wave of vibration in the transistor; and
    receiving, from the semiconductor region, a second signal produced by the transistor.

28. The method of claim 27, wherein the gate is a first gate, and the method further comprises:
    biasing the first gate using a first DC voltage; and
    biasing a second gate of the transistor using a second DC voltage.

29. The method of claim 27, wherein the second signal is received from a drain region formed in the semiconductor region.

30. A piezoelectric electromechanical device, comprising:
    a first gate;
    a first piezoelectric region;

a semiconductor region, wherein the first piezoelectric region is between the first gate and the semiconductor region;

a second piezoelectric region; and a second gate, wherein the second piezoelectric region is between the second gate and the semiconductor region, wherein the semiconductor region is structured to establish a standing wave of vibration in the piezoelectric electromechanical device in response to a signal applied to the first gate.

31. The piezoelectric electromechanical device of claim 30, wherein the semiconductor region comprises silicon.

32. The piezoelectric electromechanical device of claim 30, wherein the first piezoelectric region is formed on a sidewall of the semiconductor region.

* * * * *